US012641799B2

(12) United States Patent
Zhao et al.

(10) Patent No.: US 12,641,799 B2
(45) Date of Patent: *May 26, 2026

(54) THREE-DIMENSIONAL MEMORY DEVICES AND FABRICATING METHODS THEREOF

(71) Applicant: YANGTZE MEMORY TECHNOLOGIES CO., LTD., Wuhan (CN)

(72) Inventors: Dongxue Zhao, Wuhan (CN); Tao Yang, Wuhan (CN); Wenxi Zhou, Wuhan (CN); Yuancheng Yang, Wuhan (CN); Zhiliang Xia, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 398 days.

This patent is subject to a terminal disclaimer.

(21) Appl. No.: 18/196,247

(22) Filed: May 11, 2023

(65) Prior Publication Data

US 2023/0422524 A1  Dec. 28, 2023

Related U.S. Application Data

(63) Continuation of application No. PCT/CN2023/083734, filed on Mar. 24, 2023.

(Continued)

(30) Foreign Application Priority Data

Jun. 22, 2022  (CN) .......................... 202210714042.6

(51) Int. Cl.
*H10B 80/00* (2026.01)
*H10W 90/00* (2026.01)
*H10W 80/00* (2026.01)

(52) U.S. Cl.
CPC ............ *H10B 80/00* (2023.02); *H10W 90/00* (2026.01); *H10W 80/312* (2026.01); *H10W 80/327* (2026.01); *H10W 90/792* (2026.01)

(58) Field of Classification Search
CPC ......... H10B 80/00; H10B 51/40; H01L 24/08; H01L 24/80; H01L 25/0652; H01L 25/18;
(Continued)

(56) References Cited

U.S. PATENT DOCUMENTS

2020/0328180 A1  10/2020 Cheng et al.
2021/0265319 A1  8/2021 Liu
(Continued)

OTHER PUBLICATIONS

International Search Report issued in corresponding International Application No. PCT/CN2023/083734 mailed Jul. 17, 2023, 4 pages.

*Primary Examiner* — Thanh Y. Tran
(74) *Attorney, Agent, or Firm* — BAYES PLLC

(57) ABSTRACT

Three-dimensional (3D) memory devices and fabricating methods are disclosed. A disclosed 3D memory device includes a first semiconductor structure. The first semiconductor structure includes an array of first type through stack structures in a first region of a memory stack, an array of second type through stack structures in a second region of the memory stack, a semiconductor layer including a first portion on the array of first type through stack structures and a second portion on the array of second type through stack structures, multiple vias each penetrating the semiconductor layer and in contact with a corresponding one of the first type through stack structures or the array of second type through stack structures, and a slit structure separating the array of first type through stack structures from the array of second type through stack structures, and separating the first portion of the semiconductor layer from the second portion of the semiconductor layer.

20 Claims, 25 Drawing Sheets

200A

Related U.S. Application Data

(60) Provisional application No. 63/433,096, filed on Dec. 16, 2022.

(58) Field of Classification Search
CPC ........... H01L 25/50; H01L 2224/08145; H01L 2224/80895; H01L 2224/80896; H01L 2924/1431; H01L 2924/1441; H01L 2924/14511; H01L 2225/06527; H01L 2225/06565; H01L 25/0657
See application file for complete search history.

(56)          References Cited

U.S. PATENT DOCUMENTS

| | | | |
|---|---|---|---|
| 2021/0399014 A1 | 12/2021 | Wu et al. | |
| 2023/0422520 A1* | 12/2023 | Fan | H01L 24/08 |

* cited by examiner

<u>200B</u>

200D

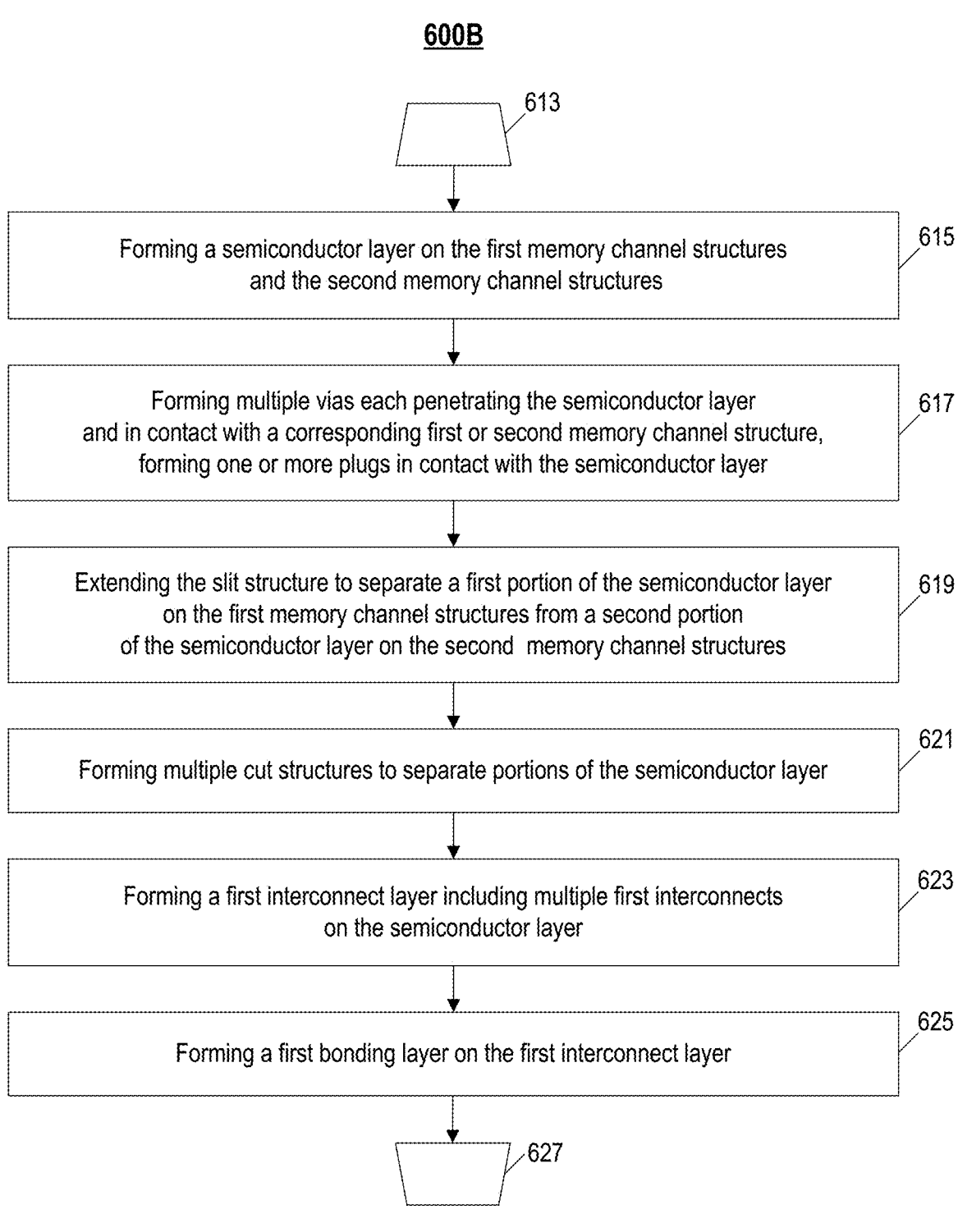

600B

613

Forming a semiconductor layer on the first memory channel structures
and the second memory channel structures

615

Forming multiple vias each penetrating the semiconductor layer
and in contact with a corresponding first or second memory channel structure,
forming one or more plugs in contact with the semiconductor layer

617

Extending the slit structure to separate a first portion of the semiconductor layer
on the first memory channel structures from a second portion
of the semiconductor layer on the second memory channel structures

619

Forming multiple cut structures to separate portions of the semiconductor layer

621

Forming a first interconnect layer including multiple first interconnects
on the semiconductor layer

623

Forming a first bonding layer on the first interconnect layer

Forming a periphery circuit layer on a second substrate — 627

Forming a second interconnect layer including multiple second interconnects on the periphery circuit layer — 629

Forming a second bonding layer on the second interconnect layer — 631

Bonding the first bonding layer and the second bonding layer — 633

THREE-DIMENSIONAL MEMORY DEVICES AND FABRICATING METHODS THEREOF

CROSS-REFERENCE TO RELATED APPLICATIONS

This application is a continuation of International Application No. PCT/CN2023/083734, filed on Mar. 24, 2023, entitled "THREE-DIMENSIONAL MEMORY DEVICES AND FABRICATING METHODS THEREOF," which claims the benefit of priorities to Chinese Application No. 202210714042.6, filed on Jun. 22, 2022, and U.S. Provisional Application No. 63/433,096, filed on Dec. 16, 2022, all of which are hereby incorporated by reference in their entireties.

TECHNICAL FIELD

The present disclosure generally relates to the field of semiconductor technology, and more particularly, to a three-dimensional (3D) memory device and a fabricating method thereof.

BACKGROUND

With continuous rising and development of artificial intelligence (AI), big data, Internet of Things, mobile devices and communications, and cloud storage, etc., the demand for memory capacity is growing in an exponential way.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, the present disclosure provides a method for forming a three-dimensional (3D) memory device, comprising: forming a first semiconductor structure, comprising: forming an array of first type through stack structures in a first region of a memory stack and an array of second type through stack structures in a second region of the memory stack; forming a semiconductor layer including a first portion over the array of first type through stack structures and a second portion on the array of second type through stack structures; forming a plurality of vias each penetrating the semiconductor layer and in contact with a corresponding one of the first type through stack structures or the second type through stack structures; and forming a slit structure to separate the array of first type through stack structures from the array of second type through stack structures, and to separate the first portion of the semiconductor layer from the second portion of the semiconductor layer.

In some implementations, forming the first semiconductor structure further comprises: forming a dielectric stack including a plurality of interleaved dielectric layers and sacrificial layers stacked on a first substrate, wherein the array of first type through stack structures and the array of second type through stack structures penetrate the dielectric stack; forming a slit vertically penetrating the dielectric stack and laterally separating the array of first type through stack structures from the array of second type through stack structures; and replacing the plurality of sacrificial layers with a plurality of conductive layers to transform the dielectric stack into the memory stack. The slit structure is formed to fill the slit.

In some implementations, the method further includes forming a second semiconductor structure including a periphery circuit on a second substrate; and bonding the second semiconductor structure to the first semiconductor structure.

In some implementations, forming the first type and second type through stack structures comprises: forming a plurality of through stack holes each penetrating the dielectric stack; filing a second subset of through stack holes with a sacrificial material; forming the first type through stack structures in a first subset of through stack holes; removing the sacrificial material in the second subset of through stack holes; and forming the second type through stack structures in the second subset of through stack holes.

In some implementations, forming the first type through stack structures comprises forming a NAND channel structure; and forming the second type through stack structures comprises forming a capacitor-type ferroelectric through stack structure.

In some implementations, forming the first type through stack structures comprises forming a NAND channel structure; and forming the second type through stack structures comprises forming a FET-type ferroelectric through stack structure.

In some implementations, the method further includes forming the vias comprises: forming a plurality of through holes each penetrating the semiconductor layer and exposing a corresponding first type or second type through stack structure; filling the through holes with a dielectric material; and forming the vias each in a corresponding through hole and surrounded by the dielectric material.

In some implementations, the method further includes forming a plurality of cut structures each laterally extending between the vias and vertically separating portions of the semiconductor layer.

In some implementations, forming the first semiconductor structure further includes forming a first interconnect layer comprising a plurality of first interconnects in contact with the vias, and forming a first bonding layer comprising a plurality of first bonding contact in contact with the first interconnects; forming the second semiconductor structure comprises: forming a second interconnect layer comprising a plurality of second interconnects in contact with a plurality of transistor of the periphery circuit, and forming a second bonding layer comprising a plurality of second bonding contacts in contact with the second interconnects; and bonding the second semiconductor structure to the first semiconductor structure comprises bonding the first bonding layer to the second bonding layer, such that each first bonding contact is joined with one corresponding second bonding contact.

Another aspect of the present disclosure provides a three-dimensional (3D) memory device, comprising: a first semiconductor structure, comprising: an array of first type through stack structures in a first region of a memory stack; an array of second type through stack structures in a second region of the memory stack; a semiconductor layer including a first portion on the array of first type through stack structures and a second portion on the array of second type through stack structures; a plurality of vias each penetrating the semiconductor layer and in contact with a corresponding one of the first type through stack structures or the array of second type through stack structures; and a slit structure separating the array of first type through stack structures from the array of second type through stack structures, and separating the first portion of the semiconductor layer from the second portion of the semiconductor layer.

In some implementations, the memory device further includes a second semiconductor structure including a periphery circuit; wherein the second semiconductor structure is bonded with the first semiconductor structure.

In some implementations, the first type through stack structures are NAND channel structures; and the second type through stack structures are capacitor-type ferroelectric through stack structures.

In some implementations, each capacitor-type ferroelectric through stack structure comprises: a ferroelectric layer; and a conductive structure laterally surrounded by the dielectric film.

In some implementations, the first type through stack structures are NAND channel structures; and the second type through stack structures are FET-type ferroelectric through stack structures.

In some implementations, each FET-type ferroelectric through stack structure comprises: a ferroelectric layer; a conductive layer laterally surrounded by the ferroelectric layer; and a dielectric filling structure laterally surrounded by the conductive layer.

In some implementations, the memory device further includes a dielectric layer on the semiconductor layer. The vias each penetrates the dielectric layer and is isolated from the semiconductor layer by a dielectric material. A plurality of cut structures each laterally extends between the vias and vertically separating portions of the semiconductor layer.

In some implementations, the first semiconductor structure further comprises: a first interconnect layer comprising a plurality of first interconnects in contact with the vias; and a first bonding layer comprising a plurality of first bonding contacts in contact with the first interconnects.

In some implementations, the second semiconductor structure further comprises: a second interconnect layer comprising a plurality of second interconnects in contact with a plurality of transistors of the periphery circuit; and a second bonding layer comprising a plurality of second bonding contacts in contact with the second interconnects, wherein the first bonding layer and the second bonding layer are bonded at a bonding interface, such that each first bonding contact is joined with one corresponding second bonding contact.

Another aspect of the present disclosure provides a memory system, comprising: a memory device configured to store data, and comprising: an array of first type through stack structures in a first region and an array of second type through stack structures in a second region; a semiconductor layer including a first portion on the array of first type through stack structures and a second portion on the array of second type through stack structures; a plurality of vias each penetrating the semiconductor layer and in contact with a corresponding one of the first type through stack structures or the array of second type through stack structures; and a slit structure separating the array of first type through stack structures from the array of second type through stack structures, and separating the first portion of the semiconductor layer from the second portion of the semiconductor layer; and a memory controller coupled to the memory device and configured to control the memory device.

In some implementations, the first type through stack structures are NAND channel structured; and the second type through stack structures are capacitor-type ferroelectric through stack structures or FET-type ferroelectric through stack structures.

Another aspect of the present disclosure provides a method for forming a three-dimensional (3D) memory device, comprising: forming a first semiconductor structure, comprising an array of first type through stack structures in a first region of a memory stack and an array of second type through stack structures in a second region of the memory stack; forming a second semiconductor structure including a periphery circuit; and bonding the second semiconductor structure to the first semiconductor structure.

In some implementations, forming the first semiconductor structure comprises: forming an array of NAND channel structures in the first region as the array of first type through stack structures; and forming an array of FET-type ferroelectric through stack structures in the second region as the array of second type through stack structures.

In some implementations, forming the first semiconductor structure further comprises: forming a dielectric stack including a plurality of interleaved dielectric layers and sacrificial layers stacked, wherein the array of first type through stack structures and the array of second type through stack structures penetrate the dielectric stack; forming a slit vertically penetrating the dielectric stack and laterally separating the array of first type through stack structures from the array of second type through stack structures; and replacing the plurality of sacrificial layers with a plurality of conductive layers to transform the dielectric stack into the memory stack; forming a slit structure to fill the slit.

In some implementations, forming the first type and second type through stack structures comprises; forming a plurality of through stack holes each penetrating the dielectric stack; filing a second subset of through stack holes with a sacrificial material; forming the first type through stack structures in a first subset of through stack holes; removing the sacrificial material in the second subset of through stack holes; and forming the second type through stack structures in the second subset of through stack holes.

In some implementations, the method further includes forming a plurality of cut structures each vertically extending to separate of a top conductive layer of the memory stack, wherein the plurality of cut structures comprise: a first cut structure laterally extending between the first type through stack structures and the second type through stack structures; a second cut structure laterally extending between the first type through stack structures; and a third cut structure laterally extending between the second type through stack structures.

In some implementations, forming the first semiconductor structure further comprises: forming a first interconnect layer comprising a plurality of first interconnects in contact with the first type through stack structures and the second type through stack structures, and forming a first bonding layer comprising a plurality of first bonding contacts in contact with the first interconnects; forming the second semiconductor structure comprises: forming a second interconnect layer comprising a plurality of second interconnects in contact with a plurality of transistor of the periphery circuit, and forming a second bonding layer comprising a plurality of second bonding contacts in contact with the second interconnects; and bonding the second semiconductor structure to the first semiconductor structure comprises bonding the first bonding layer to the second bonding layer, such that each first bonding contact is joined with one corresponding second bonding contact.

In some implementations, forming the second type through stack structures comprises: forming a ferroelectric layer on a sidewall of each of the second subset of through stack holes; forming a conductive layer to cover the ferroelectric layer; and forming a dielectric filling structure on the ferroelectric layer to fill the second subset of through stack holes.

Another aspect of the present disclosure provides a three-dimensional (3D) memory device, comprising: a first semiconductor structure comprising: a memory stack including a plurality of interleaved dielectric layers and conductive layers, an array of first type through stack structures in a first region of the memory stack, and an array of second type through stack structures in a second region of the memory stack; and a second semiconductor structure including a periphery circuit, wherein the second semiconductor structure is bonded with the first semiconductor structure.

In some implementations, the first type through stack structures are NAND channel structures; and the second type through stack structures are FET-type ferroelectric through stack structures.

In some implementations, each FET-type ferroelectric through stack structure includes a ferroelectric layer; a conductive layer laterally surrounded by the ferroelectric layer; and a dielectric filling structure laterally surrounded by the conductive layer.

In some implementations, the first type through stack structures and the second type through stack structures are located in adjacent memory blocks separated by a spacer.

In some implementations, the memory device further includes a plurality of cut structures each vertically extending to separate a top conductive layer of the memory stack, wherein the plurality of cut structures comprise: a first cut structure laterally extending between the first type through stack structures and the second type through stack structures; a second cut structure laterally extending between the first type through stack structures; and a third cut structure laterally extending between the second type through stack structures.

In some implementations, the first semiconductor structure further includes a first interconnect layer comprising a plurality of first interconnects in contact with the first type through stack structures and the second type through stack structures; and a first bonding layer comprising a plurality of first bonding contacts in contact with the first interconnects.

In some implementations, the second semiconductor structure further includes a second interconnect layer comprising a plurality of second interconnects in contact with a plurality of transistors of the periphery circuit; and a second bonding layer comprising a plurality of second bonding contacts in contact with the second interconnects, wherein the first bonding layer and the second bonding layer are bonded at a bonding interface, such that each first bonding contact is joined with one corresponding second bonding contact.

Another aspect of the present disclosure provides a memory system, comprising: a memory device configured to store data, and comprising: a first semiconductor structure comprising: a memory stack including a plurality of interleaved dielectric layers and conductive layers, an array of first type through stack structures in a first region of the memory stack, and an array of second type through stack structures in a second region of the memory stack; and a second semiconductor structure including a periphery circuit, wherein the second semiconductor structure is bonded with the first semiconductor structure; a memory controller coupled to the memory device and configured to control the memory device.

In some implementations, the first type through stack structures are NAND channel structures; and the second type through stack structures are FET-type ferroelectric through stack structures.

In some implementations, each FET-type ferroelectric through stack structure comprises: a ferroelectric layer; a conductive layer laterally surrounded by the ferroelectric layer; and a dielectric filling structure laterally surrounded by the conductive layer.

In some implementations, the memory system further includes a plurality of cut structures each vertically extending to separate a top conductive layer of the memory stack, wherein the plurality of cut structures comprise: a first cut structure laterally extending between the first type through stack structures and the second type through stack structures; a second cut structure laterally extending between the first type through stack structures; and a third cut structure laterally extending between the second type through stack structures.

In some implementations, the first semiconductor structure further includes a first interconnect layer comprising a plurality of first interconnects in contact with the first type through stack structures and the second type through stack structures; and a first bonding layer comprising a plurality of first bonding contacts in contact with the first interconnects.

In some implementations, the second semiconductor structure further includes a second interconnect layer comprising a plurality of second interconnects in contact with a plurality of transistors of the periphery circuit; and a second bonding layer comprising a plurality of second bonding contacts in contact with the second interconnects, wherein the first bonding layer and the second bonding layer are bonded at a bonding interface, such that each first bonding contact is joined with one corresponding second bonding contact.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 6A-6C illustrate a flowchart of a method for forming an exemplary 3D memory device, according to some aspects of the present disclosure.

Figure 1:
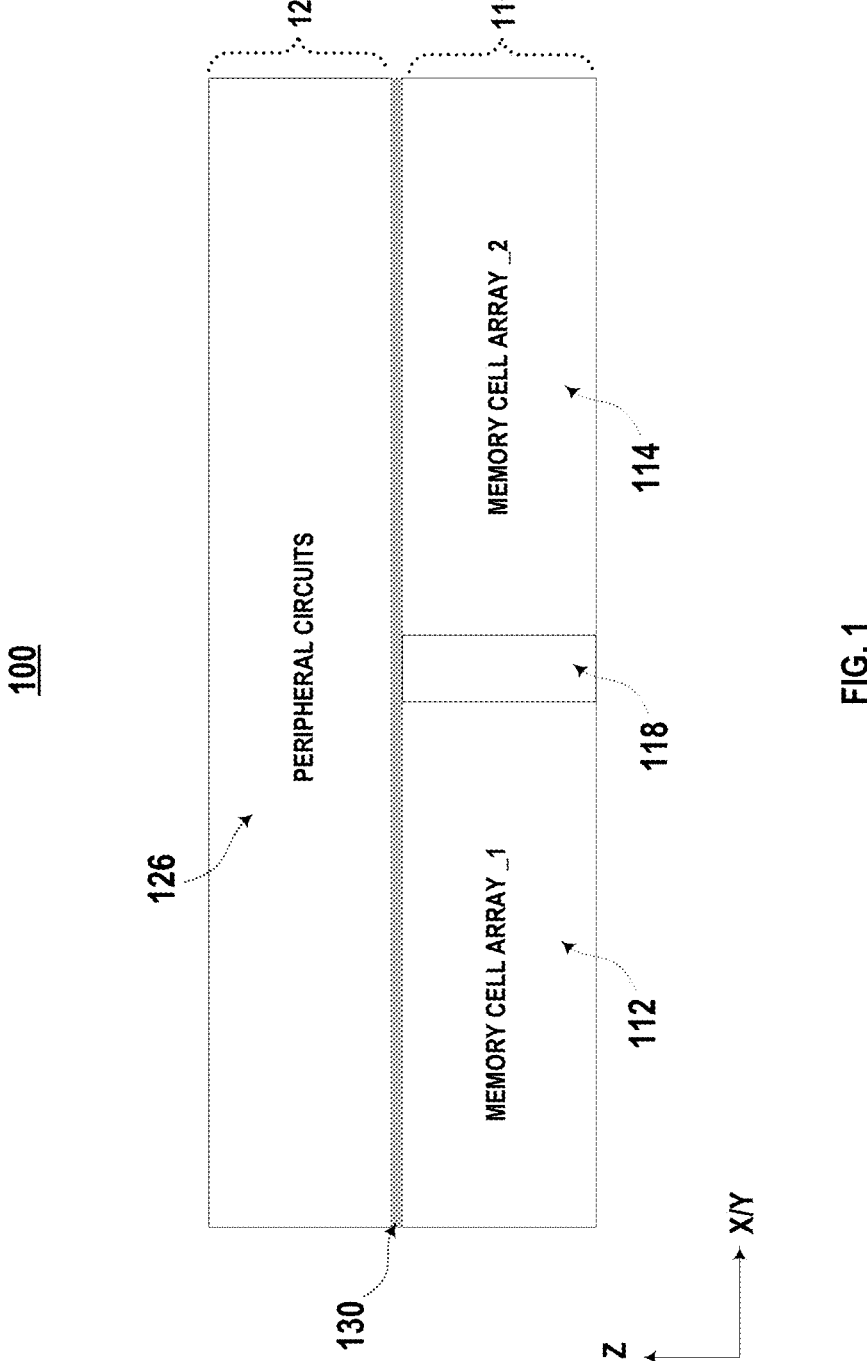
FIG. 1 illustrates a schematic diagram of a cross-sectional view of an exemplary 3D memory device, according to various aspects of the present disclosure.

The present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

The term "dynamic random-access memory" or "DRAM" as used herein indicates a volatile memory that uses charge stored on a capacitor to represent information. DRAM stores each bit in a memory cell that includes a transistor and a capacitor (e.g., 1T1C). The 1T1C design can be based on metal-oxide-semiconductor (MOS) technology. Charge levels greater than a certain threshold can represent a first logic level (e.g., 1 state), and charge levels less than another threshold amount can represent a second logic level (e.g., 0 state). Leakage currents and various parasitic effects limit the length of time a capacitor can hold charge.

The term "NAND" as used herein indicates memory designs or architectures that resemble NAND logic gates (e.g., an inverted AND gate) and connect to memory cells in series (e.g., memory strings). In NAND flash, the relationship between a bit line and a word line resembles a NAND logic gate and can be used for fast writes and high-density arrays. NAND flash can access data sequentially since the transistors in the array are connected in series (e.g., memory strings). NAND flash can be read, programmed (written), and erased in blocks or pages. NAND flash can have a smaller cell size than DRAM but can require additional circuitry to implement.

The term "surrounding gate transistor" or "SGT" as used herein indicates a memory device that has a gate surrounding a channel region of a transistor on all sides.

The term "dynamic flash memory" or "DFM" as used herein indicates a volatile memory that uses a dual-gate SGT or a multi-gate SGT. The dual gates of the dual-gate SGT can include a word line (WL) gate and a plate line (PL) gate. The plurality of gates of the multi-gate SGT can include a word line (WL) gate and multiple plate line (PL) gates. DFM can be capacitor-free and can store charge on a channel region of a transistor. DFM can still require a refresh cycle but can offer longer retention times, faster operation speeds, and higher density than compared to DRAM or other types of volatile memory. Further, similar to flash, DFM can offer block refresh and block erase operations.

The term "bit line" or "BL" as used herein indicates an array connection to address a particular memory cell in a memory array. A bit line can be connected to a drain of a transistor. A bit line can be connected to two or more serially connected memory cells (e.g., memory strings). Different voltage combinations applied to the bit line can define read, program (write), and erase operations in the memory cell.

The term "source line" or "SL" as used herein indicates an array connection to address a particular memory cell in a memory array. A source line can be connected to a source of a transistor. A source line can be connected to two or more serially connected memory cells (e.g., memory strings).

Different voltage combinations applied to the source line can define read, program (write), and erase operations in the memory cell.

The term "word line" or "WL" as used herein indicates an array connection to provide a voltage to a particular memory cell in a memory array to select which row of bits is to be read, programmed, or erased. A word line can act as a top select gate (TSG). A word line can be connected to a portion of a channel or a portion of a body of a transistor (e.g., DFM device). Different voltage combinations applied to the word line can define read, program (write), and erase operations in the memory cell. When the word line is activated, current flows only if charge is already on the memory cell. If there is charge on the channel or body of the memory cell, the read operation recharges the memory cell and is non-destructive. If there is no charge on the channel or body of the memory cell, no current flows, and the read is also non-destructive.

The term "plate line" or "PL" as used herein indicates an array connection to provide a voltage to a particular memory cell in a memory array to read, program, or erase charge on the memory cell. A plate line can be connected to a portion of a channel or a portion of a body of a transistor (e.g., DFM device). Different voltage combinations applied to the plate line can define read, program (write), and erase operations in the memory cell. When the plate line is activated, charge flows from the source line (source) to the bit line (drain). When the plate line is deactivated, any remaining charge is stored in the channel or body of the memory cell.

The term "dummy line" or "DMY" as used herein indicates an array connection, separate from a word line, to provide an additional voltage to a particular memory cell in a memory array to increase operating efficiency. A dummy line can be used for impact ionization programming to rapidly increase charge (e.g., holes) conduction generated at a word line contact to flow and increase charge (e.g., holes) in a channel of a memory cell. A dummy line can increase the program (write) rate of a memory cell.

The term "top select gate line" or "TSG" as used herein indicates an array connection to provide a voltage to a particular memory cell in a memory array to select which row of bits is to be read, programmed, or erased. The top select gate line can be used for gate-induced drain leakage (GIDL) programming to create a charge (e.g., hole) barrier to provide selective programming (writing) in a channel of a memory cell. A top select gate line can provide selective programming (writing) and increase a program (write) rate. A top select gate line can provide charge separation between a plate line and a bit line and thereby increasing charge retention times and decreasing refresh rates in a memory cell. A top select gate line can provide charge separation between a plate line and a bit line and thereby decrease junction leakage. A top select gate line can increase the depletion area of a memory cell.

The term "bottom select gate line" or "BSG" as used herein indicates an array connection to provide a voltage to a particular memory cell in a memory array to select which row of bits is to be read, programmed, or erased. The bottom select gate line can be used for gate-induced source leakage (GISL) programming to create a charge (e.g., hole) barrier to provide selective programming (writing) in a channel of a memory cell. A bottom select gate line can provide selective programming (writing) and increase a program (write) rate. A bottom select gate line can provide charge separation between a plate line and a source line and thereby increasing charge retention times and decreasing refresh rates in a memory cell. A bottom select gate line can provide charge separation between a plate line and a source line and thereby decrease junction leakage. A bottom select gate line can increase the depletion area of a memory cell.

The term "substrate" as used herein indicates a planar wafer on which subsequent layers can be deposited, formed, or grown. A substrate can be formed of a single element (e.g., Si) or a compound material (e.g., GaAs), and may be doped or undoped. For example, a substrate can include silicon (Si), germanium (Ge), silicon-germanium (SiGe), gallium arsenide (GaAs), gallium nitride (GaN), gallium phosphide (GaP+), gallium antimonide (GaSb), indium phosphide (InP+), indium antimonide (InSb), a Group IV semiconductor, a Group III-V semiconductor, a Group II-VI semiconductor, graphene, sapphire, and/or any other semiconductor material. A substrate can be a monocrystalline material (e.g., monocrystalline Si).

The term "Group III-V semiconductor" as used herein indicates comprising one or more materials from Group III of the periodic table (e.g., group 13 elements: boron (B), aluminum (Al), gallium (Ga), indium (In), thallium (Tl)) with one or more materials from Group V of the periodic table (e.g., group 15 elements: nitrogen (N), phosphorus (P+), arsenic (As), antimony (Sb), bismuth (Bi)). The compounds have a 1:1 combination of Group III and Group V regardless of the number of elements from each group. Subscripts in chemical symbols of compounds refer to the proportion of that element within that group. For example, $Al_{0.25}GaAs$ means the Group III part comprises 25% Al, and thus 75% Ga, while the Group V part comprises 100% As.

The term "Group IV semiconductor" as used herein indicates comprising two or more materials from Group IV of the periodic table (e.g., group 14 elements: carbon (C), silicon (Si), germanium (Ge), tin (Sn), lead (Pb)). Subscripts in chemical symbols of compounds refer to the proportion of that element. For example, $Si_{0.25}Ge_{0.75}$ means the Group IV part comprises 25% Si, and thus 75% Ge.

The term "Group II-VI semiconductor" as used herein indicates comprising one or more materials from Group II of the periodic table (e.g., group 12 elements: zinc (Zn), cadmium (Cd), mercury (Hg)) with one or more materials from Group VII of the periodic table (e.g., group 16 elements: oxygen (O), sulfur (S), selenium (Se), tellurium (Te)). The compounds have a 1:1 combination of Group II and Group VI regardless of the number of elements from each group. Subscripts in chemical symbols of compounds refer to the proportion of that element within that group.

The term "doping" or "doped" as used herein indicates that a layer or material contains a small impurity concentration of another element (dopant), which donates (donor) or extracts (acceptor) charge carriers from the parent material and therefore alters the conductivity. Charge carriers may be electrons or holes. A doped material with extra electrons is called n-type while a doped material with extra holes (fewer electrons) is called p-type.

The term "crystalline" as used herein indicates a material or layer with a single crystal orientation. In epitaxial growth or deposition, subsequent layers with the same or similar lattice constant follow the registry of the previous crystalline layer and therefore grow with the same crystal orientation or crystallinity.

The term "monocrystalline" as used herein indicates a material or layer having a continuous crystal lattice throughout the material or layer. Monocrystalline can indicate a single crystal or monocrystal (e.g., Si, Ge, GaAs, etc.).

The term "monolithic" as used herein indicates a layer, element, or substrate comprising bulk (e.g., single) material throughout. A monolithic element (e.g., a semiconductor body) can be formed from a single bulk material (e.g., Si).

The term "deposit" or "deposition" as used herein indicates the depositing or growth of a layer on another layer or substrate. Deposition can encompass vacuum deposition, thermal evaporation, arc vaporization, ion beam deposition, e-beam deposition, sputtering, laser ablation, pulsed laser deposition (PLD), physical vapor deposition (PVD), atomic layer deposition (ALD), chemical vapor deposition (CVD), plasma-enhanced CVD (PECVD), low pressure CVD (LPCVD), metal-organic chemical vapor deposition (MOCVD), liquid source misted chemical deposition, spin-coating, epitaxy, vapor-phase epitaxy (VPE), liquid-phase epitaxy (LPE), solid-phase epitaxy (SPE), MBE, atomic layer epitaxy (ALE), molecular-beam epitaxy (MBE), powder bed deposition, and/or other known techniques to deposit material in a layer.

The term "dielectric" as used herein indicates an electrically insulating layer. Dielectric can encompass oxide, nitride, oxynitride, ceramic, glass, spin-on-glass (SOG), polymer, plastic, thermoplastic, resin, laminate, high-k dielectric, and/or any other electrically insulating material.

The term "high-k dielectric" as used herein indicates a material with a high dielectric constant k or κ (kappa), for example, relative to the dielectric constant of silicon dioxide ($SiO_2$). High-k dielectrics can be used as a gate dielectric or another dielectric layer in an electronic device.

The term "high-k metal gate" or "high-k dielectric and conductive gate" or "HKMG" as used herein indicates a process of forming a high-k dielectric layer and a conductive (metal) layer stack in a memory device. HKMG technology can reduce gate leakage, increase transistor capacitance, and provide low power consumption for devices. Two process flows to pattern the HKMG stack are gate-first and gate-last.

The term "epitaxy" or "epitaxial" or "epitaxially" as used herein indicates crystalline growth of material, for example, via high temperature deposition.

The term "selective epitaxial growth" or "SEG" as used herein indicates local growth of an epitaxial layer through a pattern mask on a substrate or a layer. SEG provides epitaxial growth only on the exposed substrate or layer, and other regions are masked by a dielectric film or other material that is not reactive to epitaxy.

The term "dielectric stack" as used herein indicates a stack of different alternating dielectric layers in succession. For example, the first dielectric layer can be an oxide (e.g., silicon oxide), and the second dielectric layer can be a nitride (e.g., silicon nitride). The dielectric stack can be arranged in a staircase pattern.

The term "gate line trench" as used herein indicates a trench or hole extending through a dielectric stack of a memory device. The gate line trench can be used to form a gate line slit in the memory device.

The term "gate line slit" or "GLS" as used herein indicates a conductive pathway through a dielectric stack, for example, between adjacent memory blocks or adjacent memory cells. The GLS can provide a connection to an HKMG stack in a memory device. The GLS can extend vertically through the dielectric stack and extend horizontally between two adjacent arrays of memory blocks or memory cells.

Aspects of the disclosure may be implemented in hardware, firmware, software, or any combination thereof. Aspects of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; dynamic flash memory (DFM) devices, electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

In a 3D NAND flash memory, memory cells can be programmed for data storage based on charge-trapping technology. The storage information of a memory cell depends on the amount of charge trapped in a storage layer. Although 3D NAND memory can be high-density and cost-effective, it suffers from low write speed and high-power consumption at the system level due to the required periphery (e.g., charge pumps). Further, with the increasing number of 3D flash memory layers, the area of the NAND array is reduced by the reduction of the plane direction of the memory array. But the area reduction of the logical side has a mismatch with the NAND array side. Therefore, a need exists to resolve these issues while keeping the advantages of the 3D NAND technology.

On another side, a dynamic random-access memory (DRAM) is a type of random-access semiconductor memory that can store each bit of data in a memory cell. Certain types of memory cells include a capacitor and an array transistor. The capacitor can be set to either a charged or discharged state, representing the bit value of zero and one, respectively. Under the traditional von Neumann computing architecture, the smaller the capacity of DRAM is, the faster the read and write speed of DRAM is. There is a huge storage barrier between DRAM and NAND, and it is important to find a new memory device with a large storage capacity and fast read and write speed.

Ferroelectric Random Access Memory (FeRAM) is a high-performance and low-power non-volatile memory that can combine the benefits of conventional non-volatile memories (e.g., Flash and EEPROM) and high-speed RAM (e.g., SRAM and DRAM). FeRAM can outperform existing memories like EEPROM and Flash with less power consumption, faster response, and greater endurance to multiple read-and-write operations. There are two types of FeRAMs: capacitor type, and field-effect transistor (FET) type. A capacitor-type FeRAM cell includes at least one ferroelectric capacitor and at least one MOSFET used for cell selection, also referred to as an nTnC FeRAM memory cell. A FET-type FeRAM cell is capacitor-free and only includes a single ferroelectric-gate FET (FeFET). FET-type FeRAM can be integrated into high-density, because FeFET can be scaled down using the proportionality rule.

Ferroelectricity is a property observed in non-centrosymmetric dielectric crystals that show a spontaneous electric polarization, where the direction of polarization can be changed by an externally applied electric field. In a ferroelectric material, some atoms in the unit cell are misplaced to create a permanent electric dipole due to the distribution of electric charge. A macroscopic manifestation of the charge separation is the surface charge of the ferroelectric material, described by an electric polarization P. Typical ferroelectric materials, such as Lead Zirconate Titanate (PZT), Strontium Bismuth Tantalate ($SrBi_2Ta_2O_9$ or SBT), Barium Titanate ($BaTiO_3$), and $PbTiO_3$, have a perovskitetype crystal structure, where the cation in the center of the unit cell has two positions, both being stable low-energy states. The two low-energy states correspond to two opposite directions of the electric dipole. Under an external electric field, the cation can move in the direction of the electric field. Thus, by applying an external electric field across the crystal, cation in the unit cell can be moved from one low-energy position to another low-energy position, and the direction of the electric dipole can be flipped if the applied electric field is high enough. As a result, the electric polarization P in the ferroelectric material can be aligned with the direction of the external electric field.

Existing ferroelectric memory chips are generally two-dimensional architectures that are difficult to scale down. The signal margin of a FeRAM decreases with reduced cell area because it is challenging to increase the intrinsic polarization of ferroelectric material. That is, the memory array and the logic circuit are on the same plane, and the chip area will increase sharply as the memory capacity increases. That is, the storage density of FeRAM is not high enough compared to 3D NAND memory. Ferroelectric memory can learn from the 3D NAND architecture to achieve high-density storage, make full use of the advantage of capacitor height reduction, and realize a multi-capacitor stacking structure.

Various implementations in accordance with the present disclosure provide structures and fabricating methods for an integrated 3D memory device including both 3D ferroelectric memory cell array and 3D NAND memory cell array. The 3D ferroelectric memory cell array can be either capacitor type (e.g., 1TnC structure) or FET-type (e.g., capacitor-free multi-gate vertical 1T structure). By integrating the 3D ferroelectric memory cell array and the 3D NAND memory cell array on a same chip, larger storage capacity can be achieved while high operating speed requirements are also met.

FIG. 1 illustrates a schematic view of a cross-section of a 3D memory device 100, according to some aspects of the present disclosure. 3D memory device 100 represents an example of a bonded chip. In some implementations, at least some of the components of 3D memory device 100 (e.g., memory cell arrays and peripheral circuits) are formed separately on different substrates in parallel and then jointed to form a bonded chip (a process referred to herein as a "parallel process"). In some implementations, at least one semiconductor layer is attached onto another semiconductor structure using transferring bonding, then some of the components of 3D memory device 100 (e.g., memory cell arrays and peripheral circuits) are formed on the attached semiconductor layer (a process referred to herein as a "series process"). It is understood that in some examples, the components of 3D memory device 100 (e.g., memory cell arrays and peripheral circuits) may be formed by a hybrid process that combines the parallel process and the series process.

It is noted that z- and x/y-axes are added in FIG. 1 to further illustrate the spatial relationships of the components of a semiconductor device. A substrate of a semiconductor device, e.g., 3D memory device 100, includes two lateral surfaces (e.g., a top surface and a bottom surface) extending laterally in the x/y-direction (the lateral direction). As used herein, x-direction represents a word line direction (WL direction), and y-direction represents a bit line direction (BL direction). As used herein, whether one component (e.g., a layer or a device) is "on," "above," or "below" another component (e.g., a layer or a device) of a semiconductor device is determined relative to the substrate of the semiconductor device in the z-direction (the vertical direction or thickness direction) when the substrate is positioned in the lowest plane of the semiconductor device in the z-direction. The same notion for describing the spatial relationships is applied throughout the present disclosure.

3D memory device 100 can include a first semiconductor structure 110 including a first array of memory cells (also referred to herein as a "first memory cell array 112"), and a second array of memory cells (also referred to herein as a "second memory cell array 114"). The first memory cell array 112 and the second memory cell array 114 can be separated by a spacer 118. In some implementations, the first memory cell array 112 can include an array of NAND Flash memory cells, and the second memory cell array 114 can include an array of ferroelectric memory cells. In some other implementations, the first memory cell array can include an array of ferroelectric memory cells, and the second memory cell array can include an array of NAND Flash memory cells. It is noted that the ferroelectric memory cells can be either cells or FET-type ferroelectric memory cells.

In some implementations, the array of NAND memory cells is an array of 3D NAND memory strings, each of which extends vertically above a substrate in a 3D manner through a stack structure, e.g., a NAND memory stack. Depending on the 3D NAND technology (e.g., the number of layers/tiers in the memory stack), a 3D NAND memory string typically includes a certain number of NAND memory cells, each of which includes a floating-gate transistor or a charge-trap transistor.

In some implementations, the array of ferroelectric memory cells is an array of 3D ferroelectric memory strings, each of which extends vertically above the substrate in a 3D manner through a stack structure, e.g., a ferroelectric memory stack. Depending on the 3D ferroelectric memory technology (e.g., the number of layers/tiers in the memory stack), a 3D ferroelectric memory string typically includes a 1TnC FeRAM cell which includes a gate transistor and multiple ferroelectric capacitors in a capacitor type ferroelectric memory cell array, or a certain number of FeFET cells each including a ferroelectric FET in a FET-type ferroelectric memory cell array.

As shown in FIG. 1, 3D memory device 100 can further include a second semiconductor structure 120 including the peripheral circuits of the first memory cell array 112 and the second memory cell array 114. The peripheral circuits (a.k.a. control and sensing circuits) can include any suitable digital, analog, and/or mixed-signal circuits used for facilitating the operations of the memory cell array. For example, the peripheral circuits can include one or more of a page buffer, a decoder (e.g., a row decoder and a column decoder), a sense amplifier, a driver (e.g., a word line driver), an I/O circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in the second semiconductor structure 120 can use CMOS technology, e.g., which can be implemented with logic processes in any suitable technology nodes.

As shown in FIG. 1, the first and second semiconductor structures 110 and 120, and can be stacked in a vertical direction, according to some implementations. As a result, the first memory cell array 112 and the second memory cell array 114 in the first semiconductor structure 110, and the peripheral circuits 126 in the second semiconductor structure 120, can be stacked over one another in different planes to reduce the planar size of 3D memory device 100, compared with memory devices in which all the peripheral circuits are disposed in a same plane.

As shown in FIG. 1, in some implementations, 3D memory device 100 further includes a bonding interface 130 between first semiconductor structure 110 and second semiconductor structure 120. The bonding interface 130 can be an interface between two semiconductor structures formed by any suitable bonding technologies as described below in detail, such as hybrid bonding, anodic bonding, fusion bonding, transfer bonding, adhesive bonding, and eutectic bonding, to name a few.

Figure 2A:
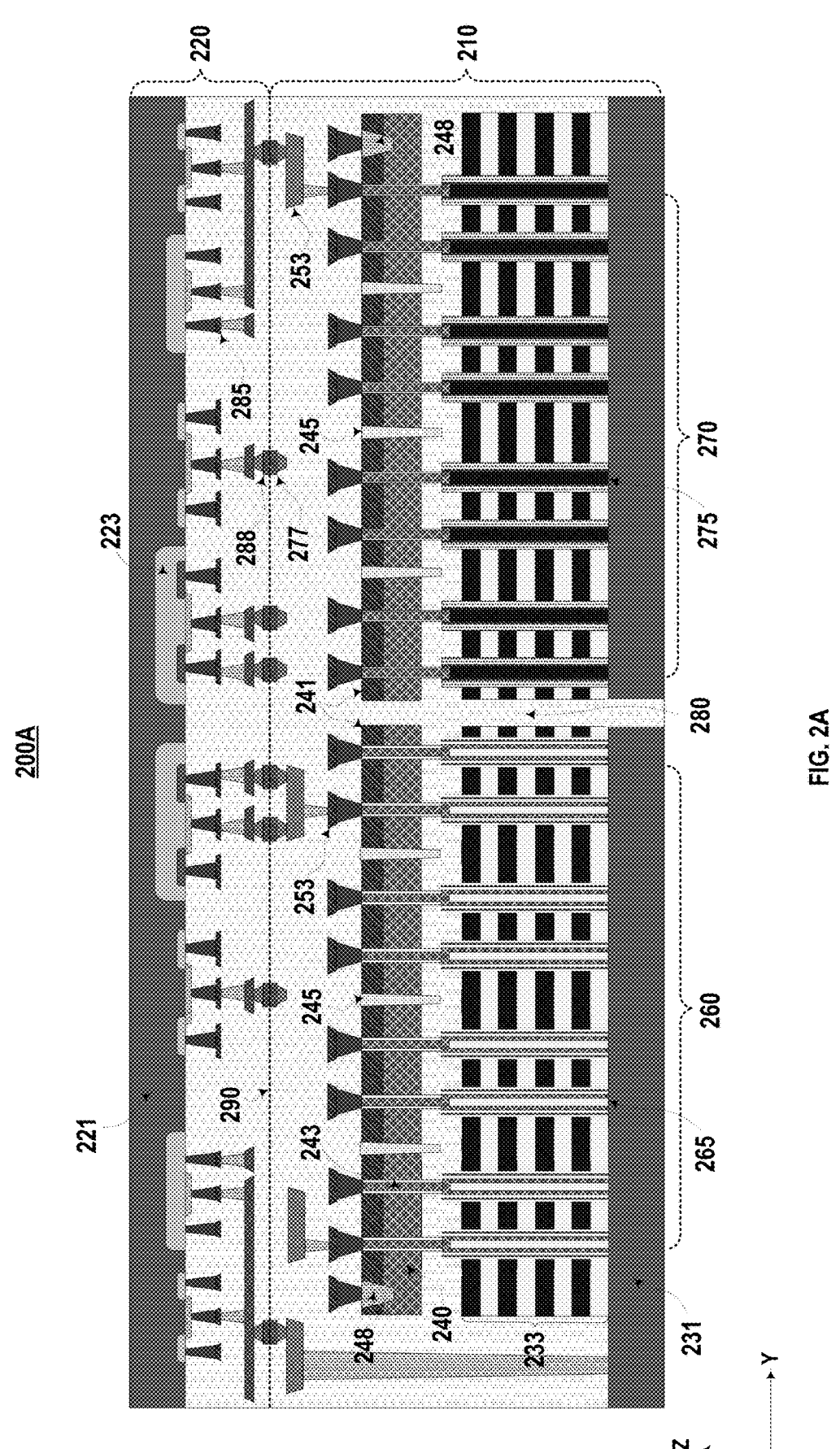
FIG. 2A is a schematic cross-sectional illustration of an exemplary 3D memory device, according to some aspects of the present disclosure.

FIG. 2A illustrates a schematic diagram of a cross-sectional side view of an exemplary 3D memory device 200A, according to some aspects of the present disclosure. 3D memory device 200A may be an example of 3D memory device 100 in FIG. 1. 3D memory device 200A is a bonded chip including first semiconductor structure 210 and second semiconductor structure 220, which are stacked in the vertical direction (e.g., the z-direction in FIG. 2A), according to some implementations.

As shown in FIG. 2A, the first semiconductor structure 210 can include a first memory array (e.g., 3D NAND Flash memory cell array) 260 and a second memory array (e.g., 3D ferroelectric memory cell array) 270 on a first semiconductor layer 231. The first memory array (e.g., 3D NAND Flash memory cell array) 260 and the second memory array (e.g., 3D ferroelectric memory cell array) 270 are separated by a spacer 280.

In some implementations, first semiconductor layer 231 can have any suitable semiconductor materials, such as silicon (e.g., single crystalline silicon, c-silicon, or polycrystalline silicon), silicon germanium (SiGe), gallium arsenide (GaAs), germanium (Ge), silicon on insulator (SOI), germanium on insulator (GOI), or any other suitable semiconductor materials. In some implementations, first semiconductor layer 231 includes single crystalline silicon and/or polycrystalline silicon. First memory array 260 and second memory array 270 can be formed on different regions of the first semiconductor layer 231.

In some implementations, first memory array 260 can include a 3D NAND Flash memory cell array, such as an array of NAND memory strings 265 on first semiconductor layer 231. The sources of NAND memory strings 265 can be in contact with first semiconductor layer 231. In some implementations, NAND memory strings 265 are disposed vertically on first semiconductor layer 231. Each NAND memory string 265 extends vertically through a plurality of pairs each including a conductive layer and a dielectric layer, according to some implementations. The stacked and interleaved conductive layers and dielectric layers are also referred to herein as a stack structure, e.g., a memory stack 233.

Figure 3A:
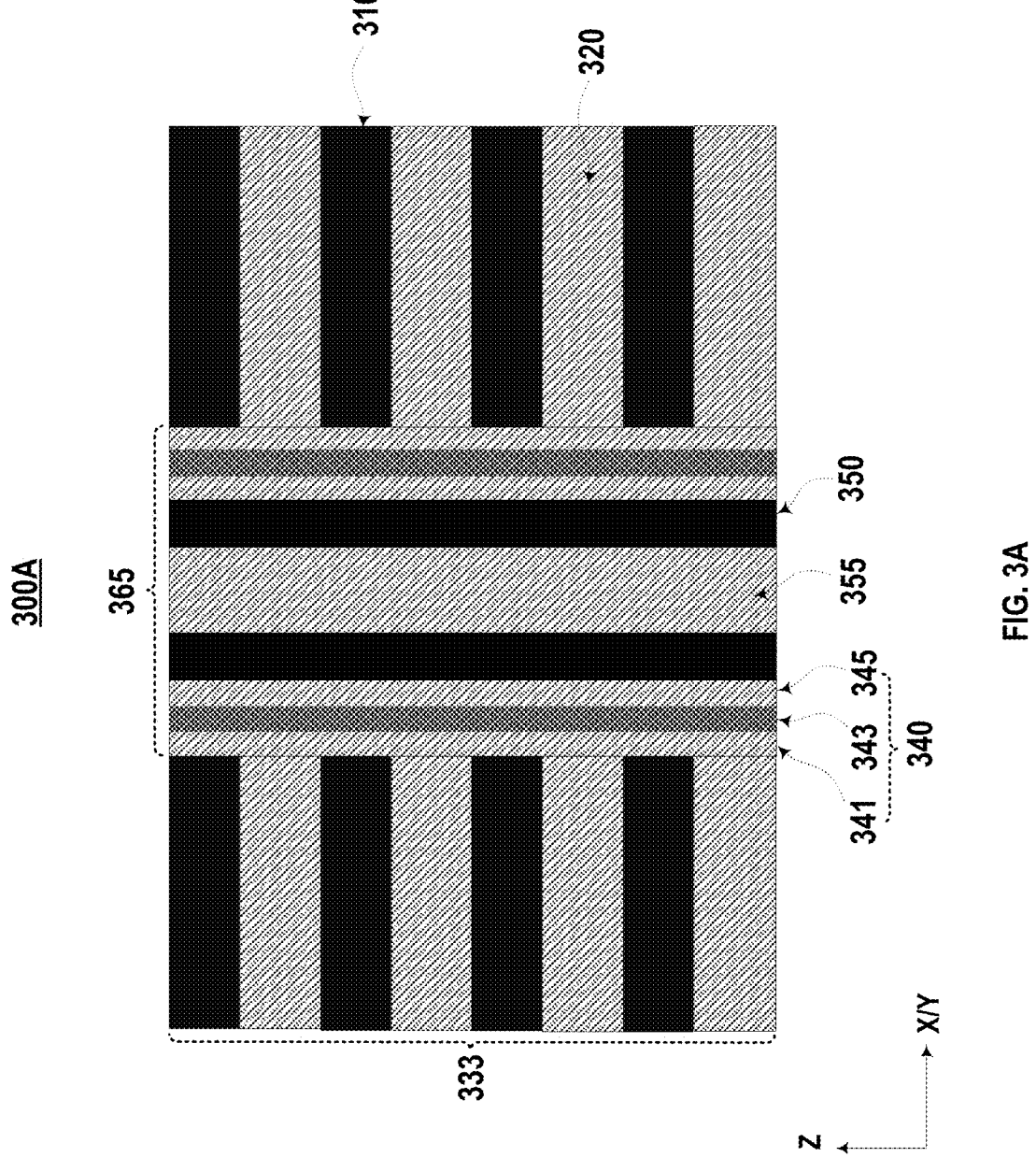
FIG. 3A is a schematic cross-sectional illustration of a portion of an exemplary 3D memory device, according to some aspects of the present disclosure.

FIG. 3A illustrates an enlarged schematic diagram 300A of a cross-sectional side view of a portion of an exemplary NAND memory string 265, according to some aspects of the present disclosure. Memory stack 333 may be an example of a portion of memory stack 233 in FIG. 2A. The conductive layers and dielectric layers in memory stack 233 may be examples of conductive layers 310 and dielectric layers 320, respectively, in memory stack 333. The interleaved conductive layers 310 and dielectric layers 320 in memory stack 333 alternate in the vertical direction, according to some implementations. Each conductive layer 310 can include a gate electrode (gate line) surrounded by an adhesive layer and a gate dielectric layer. The gate electrode of the conductive layer 310 can extend laterally as a word line, ending at one or more staircase structures (not shown) of memory stack 333.

The number of the pairs of conductive layers 310 and dielectric layers 320 in memory stack 333 can determine the number of NAND memory cells in 3D NAND Flash memory cell array 260. Conductive layer 310 can include conductive materials including, but not limited to, tungsten (W), cobalt (Co), copper (Cu), aluminum (Al), titanium nitride (TiN), platinum (Pt), ruthenium (Ru), tantalum nitride (TaN), polysilicon, doped silicon, silicides, or any combination thereof. In some implementations, each conductive layer 310 includes a metal layer, such as a tungsten layer. In some implementations, each conductive layer 310 includes a doped polysilicon layer. Each conductive layer 310 can include control gates surrounding the memory cells and can extend laterally as a word line.

As shown in FIG. 3A, NAND memory string 265 includes a NAND memory channel structure 365 extending vertically through memory stack 333. In some implementations, NAND memory channel structure 365 includes a through stack hole filled with semiconductor material(s) (e.g., as a semiconductor channel 350) and dielectric material(s) (e.g., as a memory film 340). In some implementations, semiconductor channel 350 includes silicon, such as polysilicon. In some implementations, memory film 340 is a composite dielectric layer including a tunneling layer 341, a storage layer 343 (also known as a "charge trap/storage layer"), and a blocking layer 345. NAND memory channel structure 365 can have a cylinder shape (e.g., a pillar shape). Semiconductor channel 350, tunneling layer 341, storage layer 343, blocking layer 345 are arranged radially from the center toward the outer surface of the pillar in this order, according to some implementations. Tunneling layer 341 can include silicon oxide, silicon oxynitride, or any combination thereof. Storage layer 343 can include silicon nitride, silicon oxynitride, silicon, or any combination thereof. Blocking layer 345 can include silicon oxide, silicon oxynitride, high dielectric constant (high-k) dielectrics, or any combination thereof. In one example, memory film 340 may include a composite layer of silicon oxide/silicon oxynitride/silicon oxide (ONO). A dielectric filling structure 355 can be arranged between semiconductor channel 350. In some implementations, dielectric filling structure 355 can include one or more air gaps (now shown).

Referring back to FIG. 2A, NAND memory string 265 can extend vertically through memory stack 233 above first semiconductor layer 231. In some implementations, each NAND memory string 265 is a "charge trap" type of NAND memory string including any suitable channel structures, such as bottom plug channel structure, sidewall plug channel structure, or bottom open channel structure. It is understood that NAND memory strings 265 are not limited to the "charge trap" type of NAND memory strings and may be "floating gate" type of NAND memory strings in other examples. It is also understood that in some examples, trench isolations and doped regions (not shown) may be formed in first semiconductor layer 231 as well.

As shown in FIG. 2A, first semiconductor structure 210 further includes an isolation layer 240 above the 3D NAND Flash memory cell array 260, and a semiconductor layer 241 on the isolation layer 240. In some implementations, isolation layer 240 can include any suitable dielectric materials including, but not limited to, silicon oxide, silicon nitride, silicon oxynitride, low dielectric constant (low-k) dielectrics, or any combination thereof, that can have an electrical isolation function. Semiconductor layer 241 can have any suitable semiconductor materials, such as silicon (e.g., single crystalline silicon, c-silicon, or polycrystalline silicon), silicon germanium (SiGe), gallium arsenide (GaAs), germanium (Ge), or any other suitable semiconductor materials. In some implementations, semiconductor layer 241 includes single crystalline silicon and/or polycrystalline silicon.

As shown in FIG. 2A, first semiconductor structure 210 further includes a plurality of through contacts 243 each vertically penetrating semiconductor layer 241 and isolation layer 240 and in contact with the drain end of a corresponding NAND memory string 265. It is noted that, each through contact 243 can be surrounded by a spacer to be isolated from semiconductor layer 241. A plurality of top select gate contacts 248 can be embedded in the semiconductor layer 241. A plurality of top select gate cuts 245 can penetrate semiconductor layer 241 and extend into isolation layer 240 to separate semiconductor layer 241 into a plurality of segments. As such, the plurality of through contacts 243, the plurality of top select gate contacts 248, and the plurality of segments of semiconductor layer 241 can form a plurality of top select transistors separated from each other by the plurality of top select gate cuts 245. The plurality of top select gate contacts 248 can function as top select gates of the plurality of top select transistors.

It is noted that, each NAND memory string 265 can further include a semiconductor plug (not shown) on the source end thereof, which is in contact with semiconductor channel 350 and the first semiconductor layer 231. The semiconductor plug (also known as selective epitaxial growth (SEG)) can be selectively grown from first semiconductor layer 231 and thus, has the same material as first semiconductor layer 231, such as single crystalline silicon or polycrystalline silicon.

As shown in FIG. 2A, first semiconductor structure 210 can further include an interconnect layer comprising a plurality of interconnects 253 in contact with the plurality of top select gate contacts 248 and through contacts 243 to transfer electrical signals to and from the top select transistors and the NAND memory strings 265. Interconnects 253 can include lateral lines and vertical vias. As used herein, the term "interconnects" can broadly include any suitable types of interconnects, such as middle-end-of-line (MEOL) interconnects and back-end-of-line (BEOL) interconnects. In some implementations, interconnects 253 also include local interconnects, such as bit line contacts and word line contacts. It is noted that, the interconnect layer can further include one or more interlayer dielectric (ILD) layers (also known as "intermetal dielectric (IMD) layers") in which the lateral lines and vias can form. Interconnects 253 can include conductive materials including, but not limited to W, Co, Cu, Al, silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof. In some implementations, the interconnects 253 include W, which has a relatively high thermal budget (compatible with high-temperature processes) and good quality (fewer detects, e.g., voids) among conductive metal materials.

In some implementations, second memory array 270 can include a 3D ferroelectric memory cell array, such as a capacitor-type ferroelectric memory cell array, or a FET-type ferroelectric memory cell array. The 3D ferroelectric memory cell array 270 can have similar structures compared to the 3D NAND Flash memory cell array 260, but with different through stack structures in each ferroelectric memory cell string.

Figure 3B:
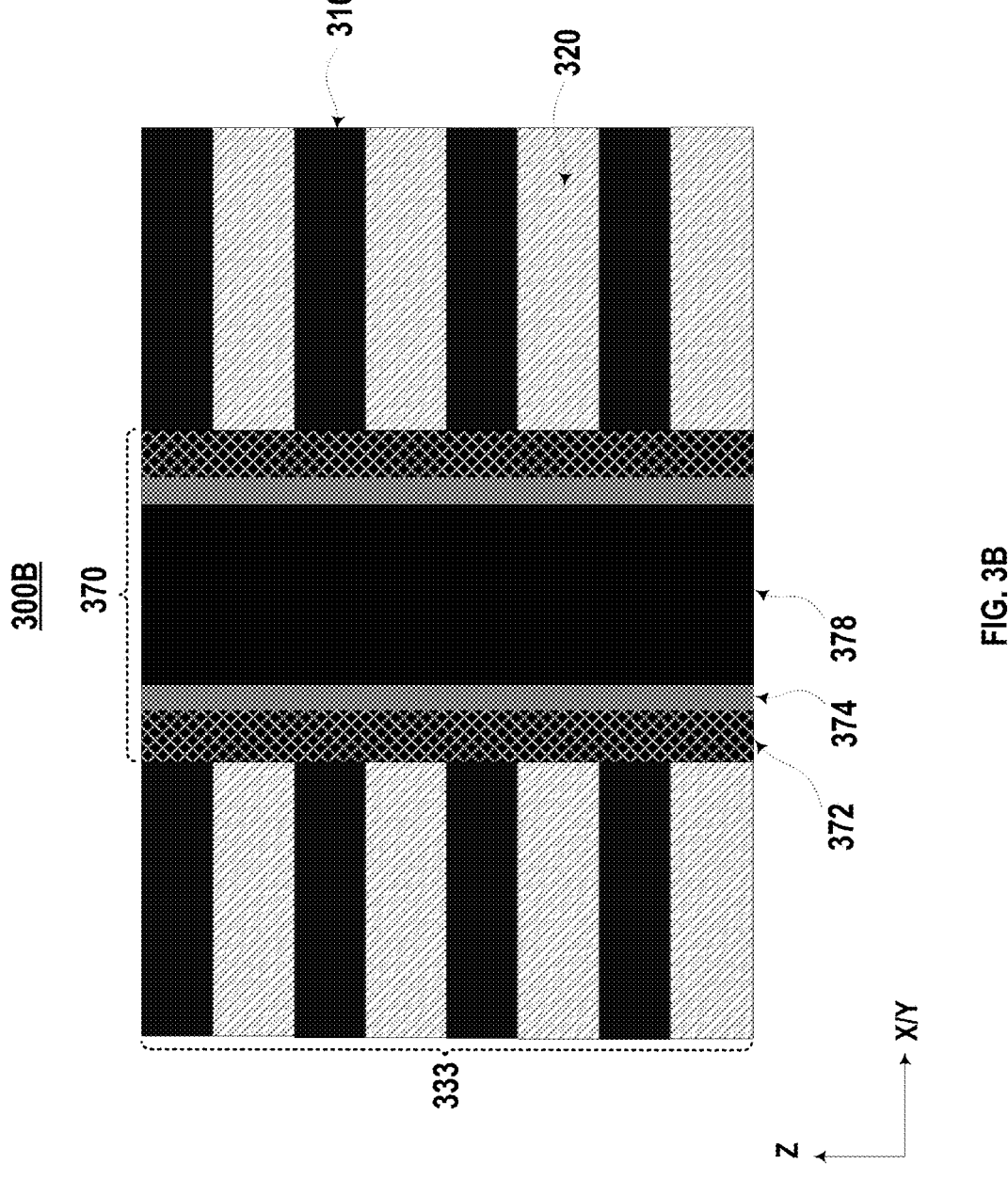
FIG. 3B is a schematic cross-sectional illustration of another portion of an exemplary 3D memory device, according to some aspects of the present disclosure.

In the capacitor-type ferroelectric memory cell array, each transistor formed in the semiconductor layer 241 can function as the transistor of one 1 TnC capacitor-type ferroelectric memory string 275. FIG. 3B illustrates an enlarged schematic diagram 300B of a cross-sectional side view of a portion of an exemplary capacitor-type ferroelectric memory string 275, according to some aspects of the present disclosure. As shown in FIG. 3B, each capacitor-type ferroelectric memory string 275 includes an FeRAM through stack structure 370 extending vertically through memory stack 333. In some implementations, FeRAM through stack structure 370 includes a through stack hole filled with ferroelectric or antiferroelectric material(s) (e.g., as a ferroelectric layer 372) and conductive material(s) (e.g., as a conductive structure 378).

In some embodiments, the ferroelectric layer 372 can include a high-k (i.e., high dielectric constant) dielectric material, which can include transitional metal oxides such as hafnium-zirconium oxide (HfZrO), hafnium oxide (HfO$_2$), aluminum oxide (Al$_2$O$_3$), Zirconium oxide (ZrO$_2$), titanium oxide (TiO$_2$), niobium oxide (Nb$_2$O$_5$), tantalum oxide (Ta$_2$O$_5$), tungsten oxide (WO$_3$), molybdenum oxide (MO$_3$), vanadium oxide (V$_2$O$_3$), lanthanum oxide (La$_2$O$_3$), and/or any combination thereof. In some embodiments, to improve ferroelectric property, the high-k dielectric material can be doped. For example, the ferroelectric layer 372 can be HZO or HfO$_2$ doped with silicon (Si), (Yttrium) Y, Gadolinium (Gd), Lanthanum (La), Zirconium (Zr) or Aluminum (Al), or any combination thereof. In some embodiments, the ferroelectric layer 372 can include Zirconate Titanate (PZT), Strontium Bismuth Tantalate (SrBi$_2$Ta$_2$O$_9$), Barium Titanate (BaTiO$_3$), PbTiO$_3$, and BLT ((Bi,La)4Ti$_3$O$_{12}$), or any combination thereof.

In some embodiments, the ferroelectric layer 372 can be disposed by chemical vapor deposition (CVD), for example, metal organic chemical vapor deposition (MOCVD), low pressure chemical vapor deposition (LPCVD), plasma enhanced chemical vapor deposition (PECVD), high-density plasma chemical vapor deposition (HDP-CVD), etc. The ferroelectric layer 372 can also be disposed by atomic layer deposition (ALD), sputtering, evaporating, or any combination thereof. In some embodiments, the ferroelectric layer 372 can have a thickness in a range between 5 nm and 100 nm. It is noted that, in some implementations as shown in FIGS. 2A and 3B, the ferroelectric layer 372 are located on the sidewall of each though hole in the memory stack 333. In some other implementations not shown in FIGS. 2A and 3B, the ferroelectric layer 372 can be also located on the bottom of each though hole in the memory stack 333 and can be in contact with the first semiconductor layer 231.

In some embodiments, the conductive structure 378 can include conductive materials including, but not limited to, tungsten (W), cobalt (Co), copper (Cu), aluminum (Al), titanium nitride (TiN), platinum (Pt), ruthenium (Ru), tantalum nitride (TaN), polysilicon, doped silicon, silicides, or any combination thereof. A dielectric film 374 can be sandwiched between the ferroelectric layer 372 and the conductive structure 378. In some implementations, the dielectric film 374 can include any suitable dielectric material, such as TiN. As shown in FIG. 3B, the ferroelectric layer 372, the dielectric film 374, and the conductive structure 378, are arranged radially from the center toward the outer surface of the pillar in this order, according to some implementations.

As shown in FIG. 3B, the plurality of conductive layers 310 and the conductive structure 378 separated by the ferroelectric layer 372 and the dielectric film 374 can form a plurality of multiple parallel-connected capacitors of the 1TnC capacitor-type ferroelectric memory string 275 as shown in FIG. 2A. Each conductive layer 310 can function as a plate line of the 1TnC capacitor-type ferroelectric memory string 275. In some embodiments, the number n of the multiple parallel-connected capacitors of the 1TnC capacitor-type ferroelectric memory string 275 can be adjusted by connecting a certain number of the plate lines through staircase contacts in the staircase region (not shown). The conductive structure 378 together with the corresponding through contact 243 can function as the channel of the 1TnC capacitor-type ferroelectric memory string 275. The top select gate contact 248 can function as the word line of the 1TnC capacitor-type ferroelectric memory string 275, and the interconnect 253 in contact with the through contact 243 can function as the bit line of the 1TnC capacitor-type ferroelectric memory string 275.

Figure 3C:
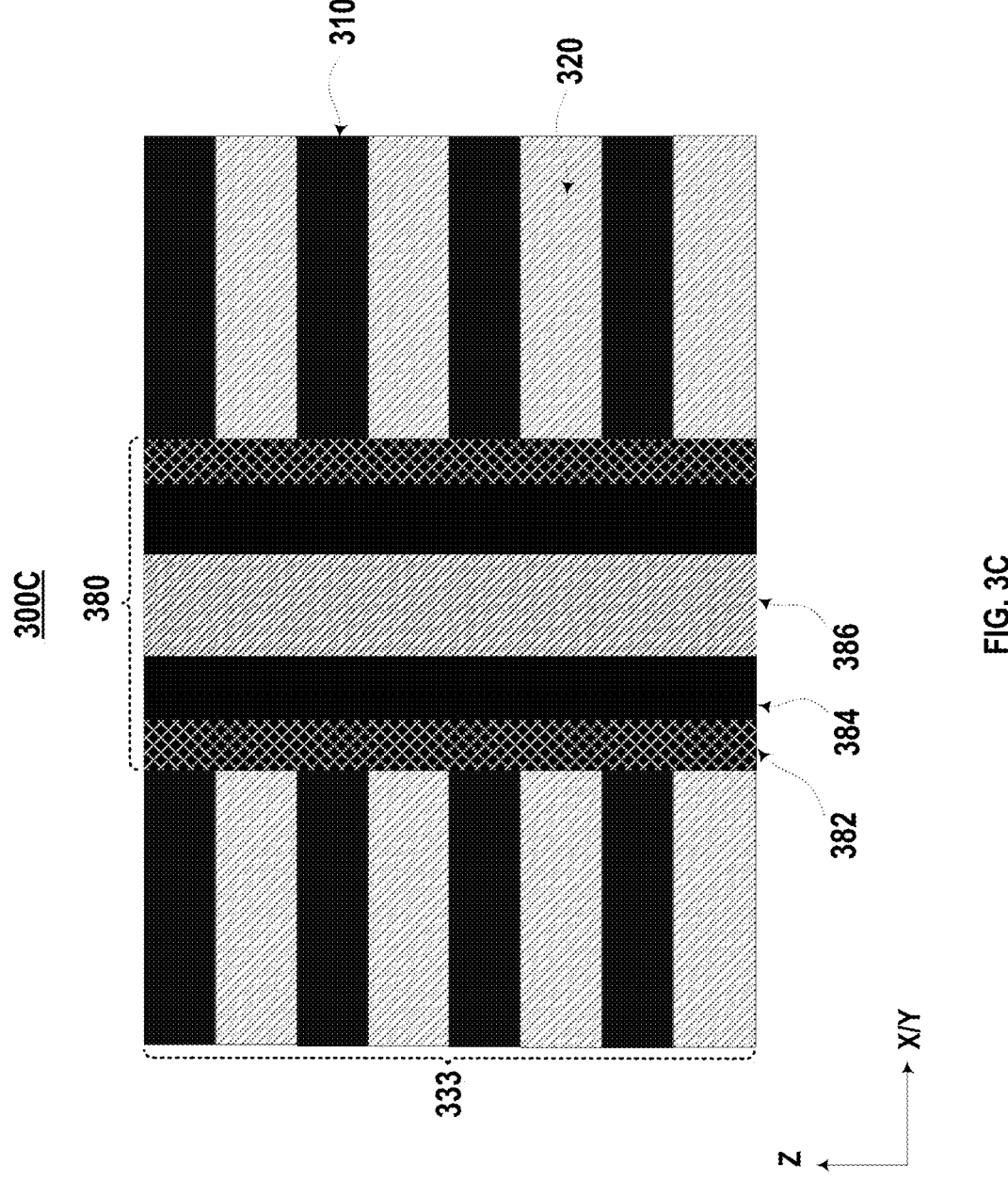
FIG. 3C is a schematic cross-sectional illustration of a portion of an exemplary 3D memory device, according to some aspects of the present disclosure.

In the FET-type ferroelectric memory cell array, each transistor formed in the semiconductor layer 241 can function as a top select transistor of one capacitor-free FeFET cell string 275' (not shown but replacing the 1TnC capacitor-type ferroelectric memory string 275 in FIG. 2A). FIG. 3C illustrates an enlarged schematic diagram 300C of a cross-sectional side view of a portion of an exemplary FET-type ferroelectric memory string 275', according to some aspects of the present disclosure. As shown in FIG. 3C, each FET-type ferroelectric memory string 275' includes an FeFET through stack structure 380 extending vertically through memory stack 333. Each of the plurality of conductive layers 310 can function as a word line of a corresponding FeFET cell. In some implementations, FeFET through stack structure 380 includes a through stack hole filled with ferroelectric or antiferroelectric material(s) (e.g., as a ferroelectric layer 372) and conductive material(s) (e.g., as a conductive layer 384).

In some embodiments, the ferroelectric layer 382 can include a high-k (i.e., high dielectric constant) dielectric material, which can include transitional metal oxides such as hafnium-zirconium oxide (HfZrO), hafnium oxide (HfO$_2$), aluminum oxide (Al$_2$O$_3$), Zirconium oxide (ZrO$_2$), titanium oxide (TiO$_2$), niobium oxide (Nb$_2$O$_5$), tantalum oxide (Ta$_2$O$_5$), tungsten oxide (WO$_3$), molybdenum oxide (MO$_3$), vanadium oxide (V$_2$O$_3$), lanthanum oxide (La$_2$O$_3$), and/or any combination thereof. In some embodiments, to improve ferroelectric property, the high-k dielectric material can be doped. For example, the ferroelectric layer 382 can be HZO or HfO$_2$ doped with silicon (Si), (Yttrium) Y, Gadolinium (Gd), Lanthanum (La), Zirconium (Zr) or Aluminum (Al), or any combination thereof. In some embodiments, the ferroelectric layer 382 can include Zirconate Titanate (PZT), Strontium Bismuth Tantalate (SrBi$_2$Ta$_2$O$_9$), Barium Titanate (BaTiO$_3$), PbTiO$_3$, and BLT ((Bi,La)4Ti$_3$O$_{12}$), or any combination thereof.

In some embodiments, the ferroelectric layer 382 can be disposed by chemical vapor deposition (CVD), for example, metal organic chemical vapor deposition (MOCVD), low pressure chemical vapor deposition (LPCVD), plasma enhanced chemical vapor deposition (PECVD), high-density plasma chemical vapor deposition (HDP-CVD), etc. The ferroelectric layer 382 can also be disposed by atomic layer deposition (ALD), sputtering, evaporating, or any combination thereof. In some embodiments, the ferroelectric layer 382 can have a thickness in a range between 5 nm and 100 nm.

In some embodiments, the conductive layer 384 can include conductive materials including, but not limited to, tungsten (W), cobalt (Co), copper (Cu), aluminum (Al), titanium nitride (TiN), platinum (Pt), ruthenium (Ru), tantalum nitride (TaN), polysilicon, doped silicon, silicides, or any combination thereof. A dielectric filling structure 386 can be enclosed by conductive layer 384. In some implementations, dielectric filling structure 386 can include one or more air gaps (now shown). As shown in FIG. 3C, the ferroelectric layer 382, the conductive layer 384, and the dielectric filling structure 386 are arranged radially from the center toward the outer surface of the pillar in this order, according to some implementations.

Referring back to FIG. 2A, first semiconductor structure 210 can further include a first bonding layer comprising conductive bonding contacts 277 and dielectrics electrically isolating the conductive bonding contacts 277, which can be used, for example, for hybrid bonding as described below in detail. Conductive bonding contacts 277 can be MEOL/BEOL interconnects and/or contact pads including any suitable conductive materials including, but not limited to W, Co, Cu, Al, silicides, or any combination thereof.

As shown in FIG. 2A, second semiconductor structure 220 can be bonded on top of first semiconductor structure 210 in a face-to-face manner at bonding interface 290. Second semiconductor structure 220 can include second semiconductor layer 221 having semiconductor materials. In some implementations, second semiconductor layer 221 is a layer of single crystalline silicon or polycrystalline silicon.

As shown in FIG. 2A, second semiconductor structure 220 can include a device layer on and in contact with second semiconductor layer 221. In some implementations, the device layer includes one or more peripheral circuits of the 3D ferroelectric memory cell array 270 and the 3D NAND Flash memory cell array 260. In some implementations, the one or more peripheral circuits can include a plurality of transistors 223 formed in contact with second semiconductor layer 221. In some implementations, trench isolations (e.g., STIs, now shown) and doped regions (e.g., wells, sources, and drains of transistors 223, not shown) can be formed on or in second semiconductor layer 221 as well.

In some implementations, second semiconductor structure 220 further includes an interconnect layer comprising a plurality of interconnects 285, such as MEOL interconnects and BEOL interconnects, to transfer electrical signals to and from the one or more first peripheral circuits. As shown in FIG. 2A, the interconnects 285 can be coupled to the transistors 223 of the one or more first peripheral circuits in the device layer. The interconnect layer can further include one or more ILD layers in which the lateral lines and vias can form. In some implementations, the transistors 223 in the device layer are coupled to one another through the interconnects 285 in the interconnect layer. The interconnects 285 can include conductive materials including, but not limited to, W, Co, Cu, Al, silicides, or any combination thereof. The ILD layers in interconnect layer can include dielectric materials including, but not limited to, silicon oxide, silicon nitride, silicon oxynitride, low-k dielectrics, or any combination thereof. In some implementations, the interconnects 285 include W, which has a relatively high thermal budget (compatible with high-temperature processes) and good quality (fewer detected, e.g., voids) among conductive metal materials.

In some implementations, second semiconductor structure 220 can further include a second bonding layer comprising conductive bonding contacts 288 and dielectrics electrically isolating the bonding contacts 288, which can be used, for example, for hybrid bonding as described below in detail. Conductive bonding contacts 288 can be MEOL/BEOL interconnects and/or contact pads including any suitable conductive materials including, but not limited to W, Co, Cu, Al, silicides, or any combination thereof.

In some implementations, bonding interface 290 is disposed vertically between the first bonding layer of the first semiconductor structure 210 and the second bonding layer of the second semiconductor layer 221 as a result of hybrid bonding. That is, conductive bonding contacts 277 of the first bonding layer can be in contact with the bonding contacts 288 of the second bonding layer at bonding interface 290. As a result, a plurality of bonding contacts across bonding interface 290 can make direct, short-distance (e.g., micron-level) electrical connections between first and second semiconductor structures 210 and 220. In some implementations, dielectric layer(s) (e.g., silicon oxide layer) are formed vertically between bonding interface 290. Thus, it is understood that bonding interface 290 may include the surfaces of the dielectric layer(s) in some examples.

Figure 2B:
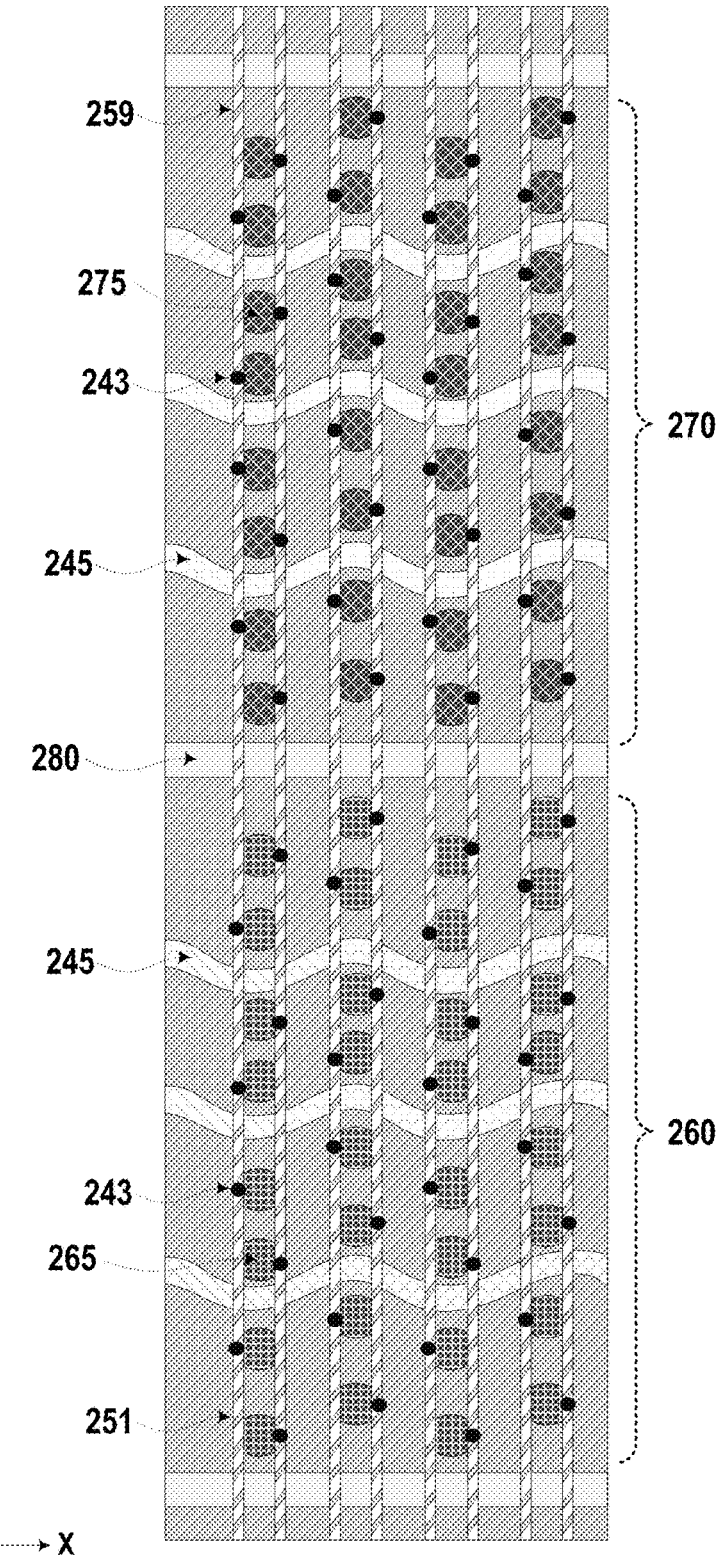
FIG. 2B is a schematic top-down illustration of an exemplary 3D memory device, according to some aspects of the present disclosure.

Referring to FIG. 2B, a schematic diagram of a top view of a portion of an exemplary 3D memory device 200B is illustrated according to some aspects of the present disclosure. It is noted that FIG. 2B illustrated a top view of the first semiconductor structure 210 shown in FIG. 2A. First memory array 260 (e.g., 3D NAND Flash memory cell array) and second memory array 270 (e.g., ferroelectric memory cell array) can be separated by spacer 280. Top select gate cut 245 can extend between NAND memory strings 265 or ferroelectric memory strings 275 along the x-direction (i.e., WL direction) to separate the semiconductor layer 241 into a plurality of segments. The through contacts 243 connected with the NAND memory strings 265 are coupled with a plurality of bit lines 251. In some implementations, the through contacts 243 connected with the capacitor-type ferroelectric memory strings 275 are coupled with a plurality of bit lines 259. In some other implementations, the through contacts 243 connected with the FET-type ferroelectric memory strings 275' are coupled with a plurality of bit lines 259.

Figure 2C:
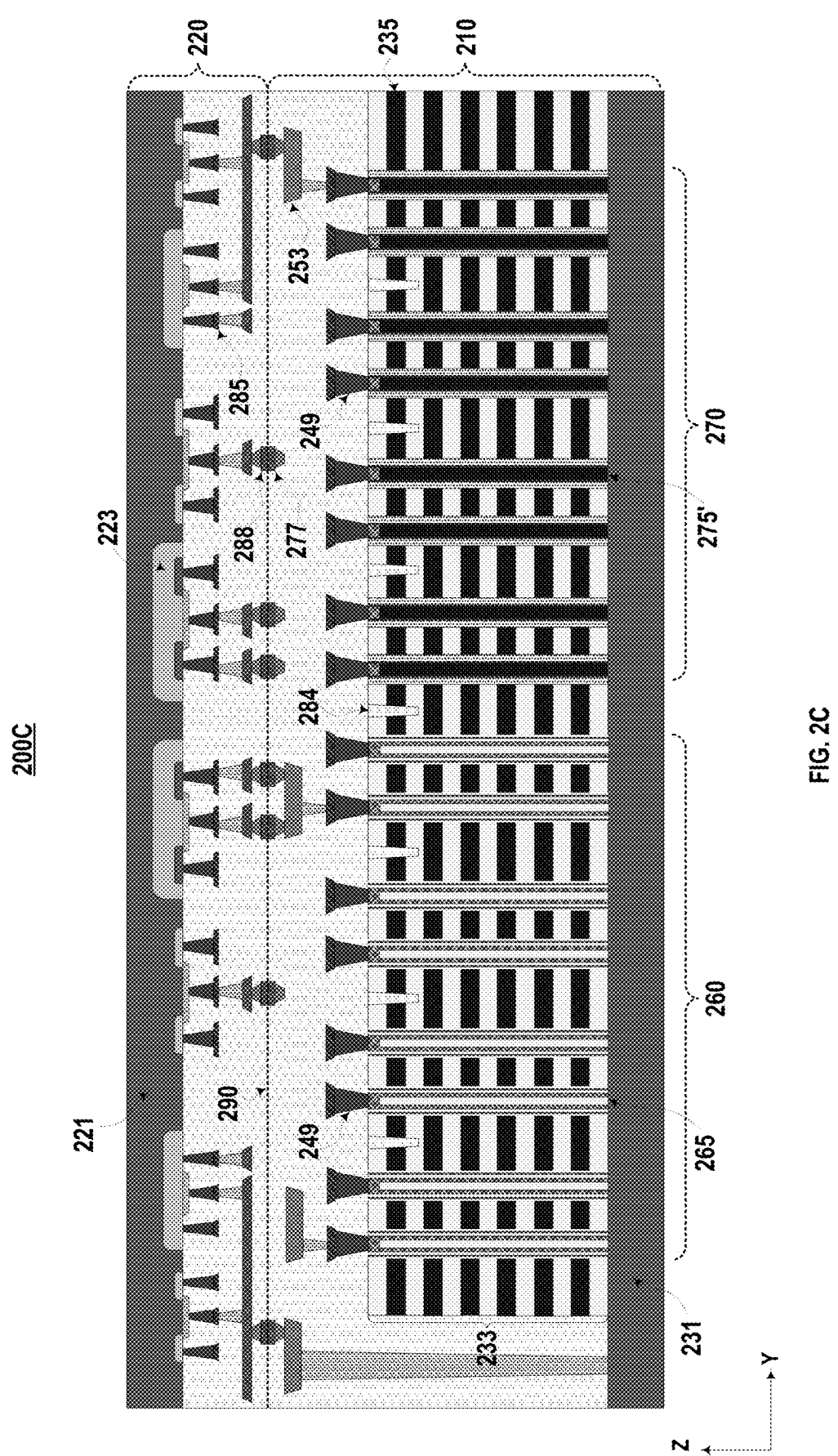
FIG. 2C is a schematic cross-sectional illustration of another exemplary 3D memory device, according to some other aspects of the present disclosure.

FIG. 2C illustrates a schematic diagram of a cross-sectional side view of another exemplary 3D memory device 200C, according to some other aspects of the present disclosure. 3D memory device 200C may be another example of 3D memory device 100 in FIG. 1. As shown in FIG. 2C, in some implementations, the first memory array 260 is a NAND memory cell array, and the second memory array 270 (e.g., ferroelectric memory cell array) is an FET-type ferroelectric memory cell array including a plurality of FeFET ferroelectric memory string 275' described above in connection with FIG. 3C.

In such implementations, each transistor formed in one or more top conductive layers 235 (a top conductive layer 235 shown in FIG. 2C as an example) of memory stack 233 can function as a top select transistor of one NAND memory string 265 or one capacitor-free FeFET ferroelectric memory string 275'. The rest of the plurality of conductive layers of memory stack 233 can function as word lines of the NAND memory strings 265 and the FeFET ferroelectric memory strings 275'. As such, the semiconductor layer 240 and corresponding through contacts 243 shown in FIG. 2A can be omitted. Further, since the word lines can be shared by both the NAND memory cell array 260 and the FET-type ferroelectric memory cell array 270, the spacer 280 between the two memory arrays shown in FIG. 2A can be also omitted. A plurality of top select gate cut 284 can be formed to separate the one or more top conductive layers 235 into portions along the bit line direction (i.e., y-direction). In some other implementations not shown in FIG. 2C, a spacer (e.g., spacer 280 as shown in FIG. 2A) can be formed under one select gate cut 284 between the first memory array 260 and the second memory array 270. In some other implementations not shown in FIG. 2C, the select gate cut 284 between the first memory array 260 and the second memory array 270 can be replaced by a spacer (e.g., spacer 280 as shown in FIG. 2A) to separate the first memory array 260 and the second memory array 270.

Figure 2D:
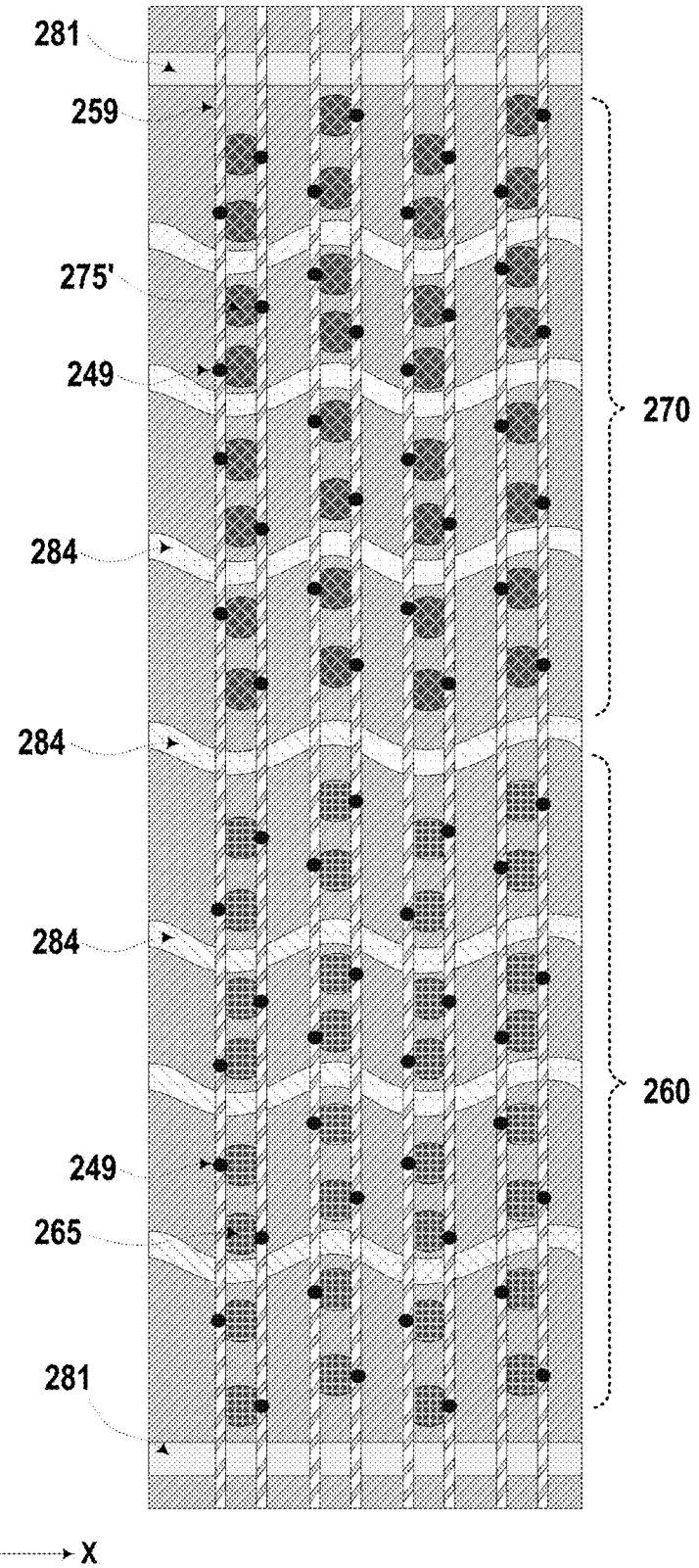
FIG. 2D is a schematic top-down illustration of another exemplary 3D memory device, according to some other aspects of the present disclosure.

Referring to FIG. 2D, a schematic diagram of a top view of a portion of another exemplary 3D memory device 200D is illustrated according to some aspects of the present disclosure. It is noted that FIG. 2D illustrated a top view of the first semiconductor structure 210 shown in FIG. 2C. First memory array 260 (e.g., 3D NAND Flash memory cell array) and second memory array 270 (e.g., FET-type ferroelectric memory cell array) can be formed in a single memory block between adjacent gate line slit cuts 281. Top select gate cuts 284 extend between NAND memory strings 265 and/or FeFET ferroelectric memory string 275' along the x-direction (i.e., WL direction) to separate the top conductive layers 235 of memory stack 233 into a plurality of segments. The contacts 249 connected with corresponding NAND memory strings 265 or FeFET ferroelectric memory strings 275' are coupled with a plurality of bit lines 259.

Figure 4:
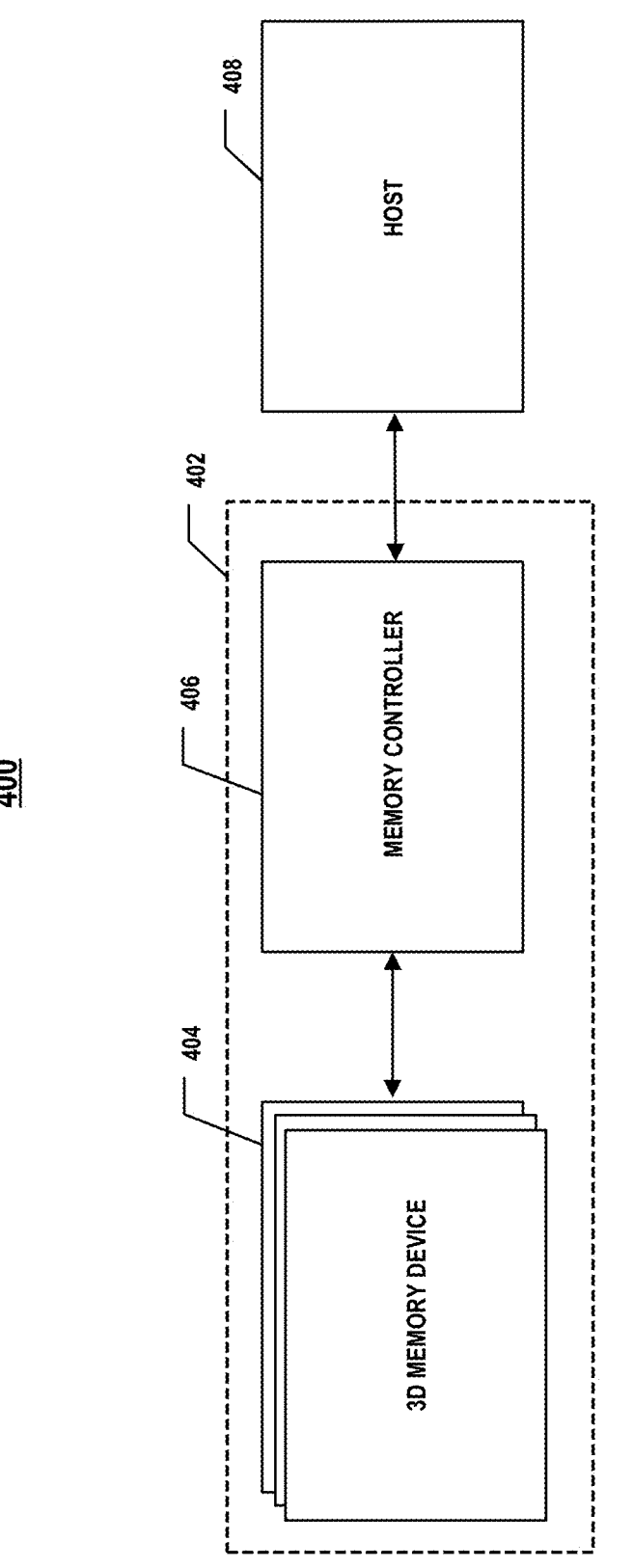
FIG. 4 illustrates a block diagram of an exemplary system having a memory device, according to some aspects of the present disclosure.

FIG. 4 illustrates a block diagram of a system 400 having a memory device, according to some aspects of the present disclosure. System 400 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 4, system 400 can include a host 408 and a memory system 402 having one or more memory devices 404 and a memory controller 406. Host 408 can be a processor of an electronic device, such as a central processing unit (CPU), or a system-on-chip (SoC), such as an application processor (AP). Host 408 can be configured to send or receive the data to or from memory devices 404.

Memory device 404 can be any memory devices disclosed herein, such as 3D memory device 100. In some implementations, each memory device 404 includes memory cell arrays and peripheral circuits of the memory cell arrays that are stacked over one another in different planes, as described above in detail.

Memory controller 406 is coupled to memory device 404 and host 408 and is configured to control memory device 404, according to some implementations. Memory controller 406 can manage the data stored in memory device 404 and communicate with host 408. In some implementations, memory controller 406 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 406 is designed for operating in a high duty-cycle environment SSDs or embedded multi-media-cards (eMMCs) used as data storage for mobile devices, such as smartphones, tablets, laptop computers, etc., and enterprise storage arrays. Memory controller 406 can be configured to control operations of memory device 404, such as read, erase, and program operations. In some implementations, memory controller 406 is configured to control the array of memory cells through the first peripheral circuit and the second peripheral circuit. Memory controller 406 can also be configured to manage various functions with respect to the data stored or to be stored in memory device 404 including, but not limited to bad-block management, garbage collection, logical-to-physical address conversion, wear leveling, etc. In some implementations, memory controller 406 is further configured to process error correction codes (ECCs) with respect to the data read from or written to memory device 404. Any other suitable functions may be performed by memory controller 406 as well, for example, formatting memory device 404. Memory controller 406 can communicate with an external device (e.g., host 408) according to a particular communication protocol. For example, memory controller 406 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 406 and one or more memory devices 404 can be integrated into various types of storage devices, for example, be included in the same package, such as a universal Flash storage (UFS) package or an eMMC package. That is, memory system 402 can be implemented and packaged into different types of end electronic products.

Figure 5B:
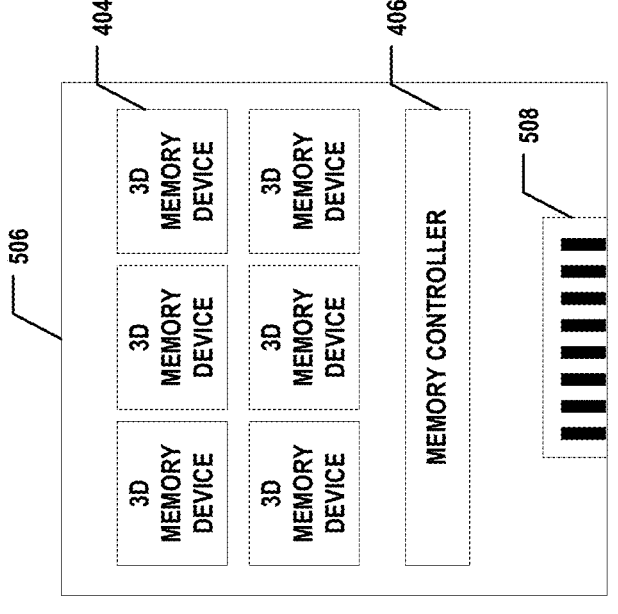
FIG. 5B illustrates a diagram of an exemplary solid-state drive (SSD) having a memory device, according to some aspects of the present disclosure.
Figure 5A:
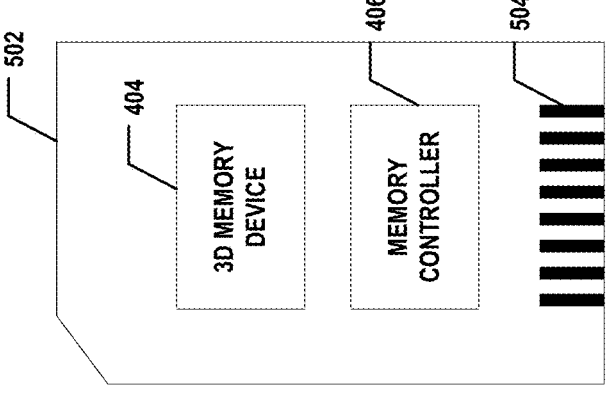
FIG. 5A illustrates a diagram of an exemplary memory card having a memory device, according to some aspects of the present disclosure.

In one example as shown in FIG. 5A, memory controller 406 and a single memory device 404 may be integrated into a memory card 502. Memory card 502 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 502 can further include a memory card connector 504 coupling memory card 502 with a host (e.g., host 408 in FIG. 13). In another example as shown in FIG. 5B, memory controller 406 and multiple memory devices 404 may be integrated into an SSD 506. SSD 506 can further include an SSD connector 508 coupling SSD 506 with a host (e.g., host 408 in FIG. 13). In some implementations, the storage capacity and/or the operation speed of SSD 506 is greater than those of memory card 502.

Figure 6A:
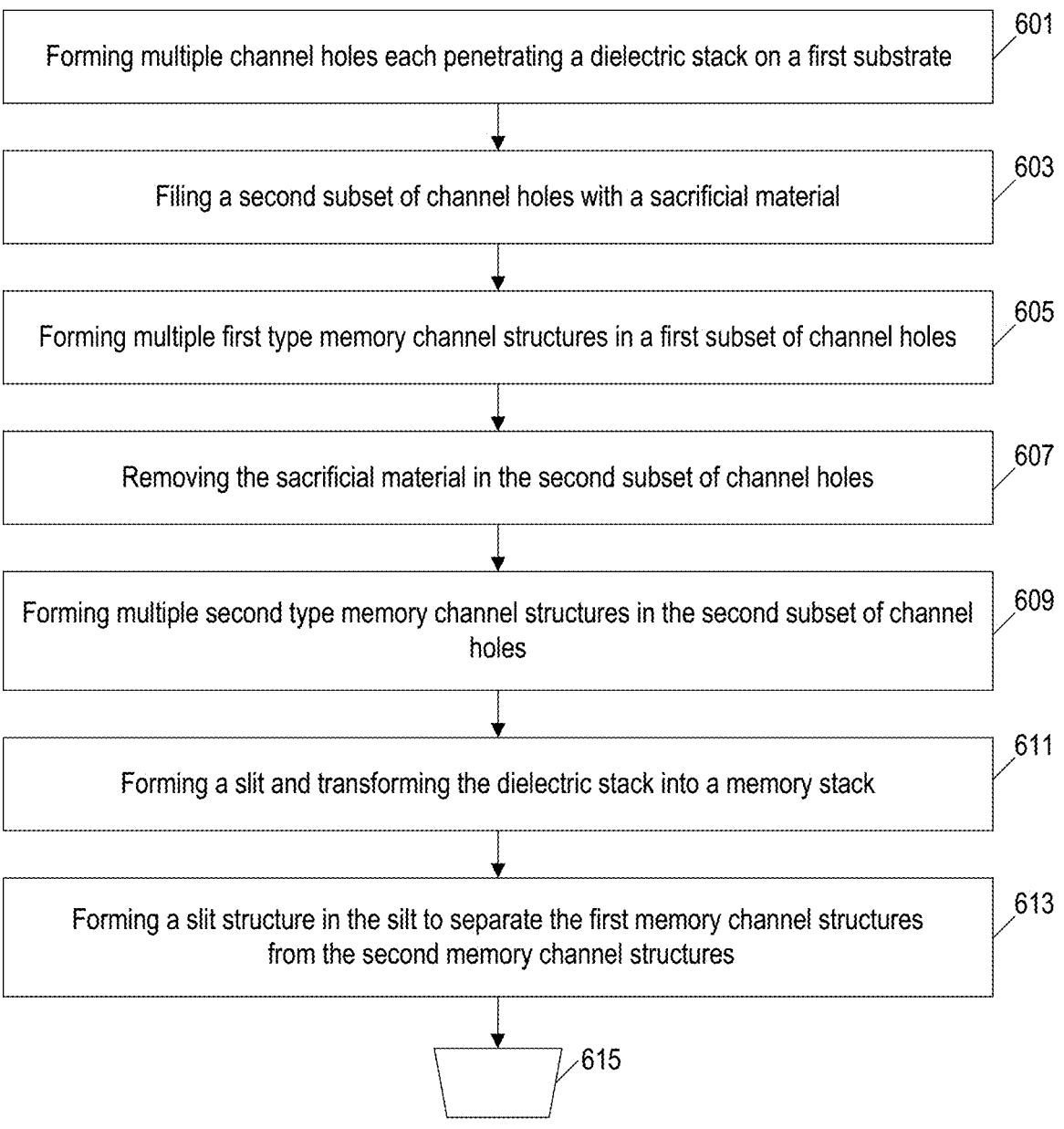
Figure 6C:
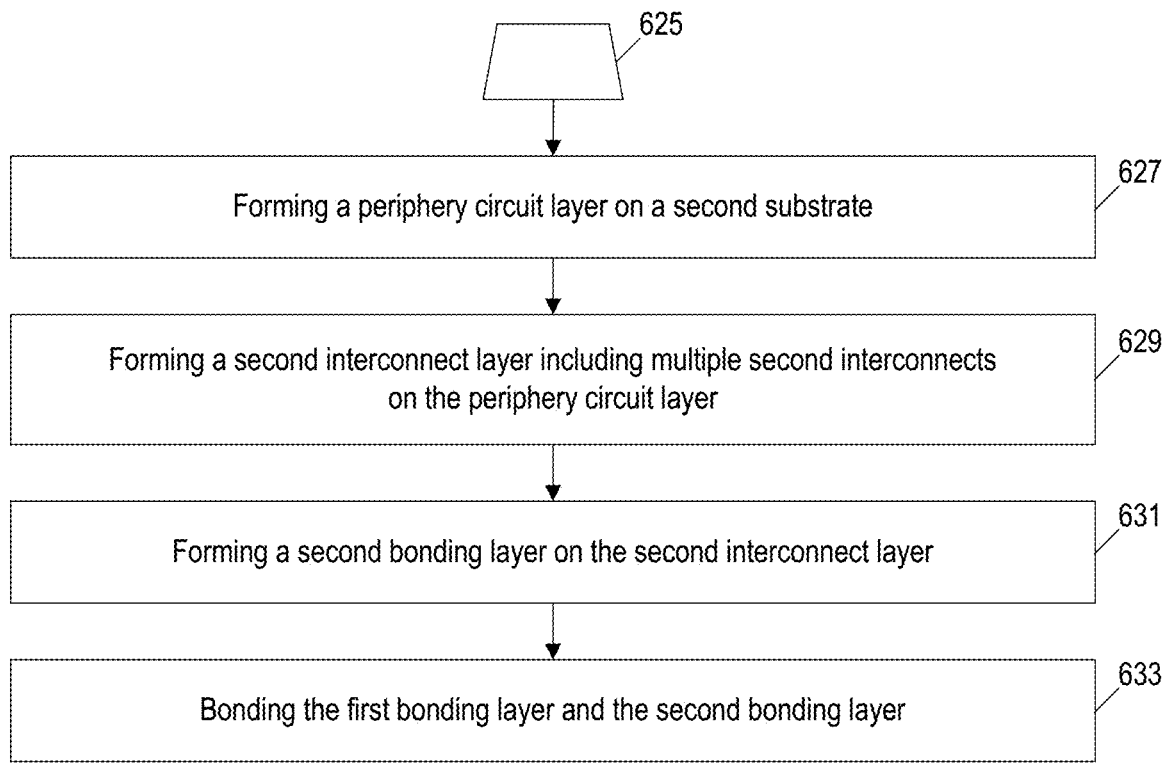

Referring to FIGS. 6A-6C, a flow diagram of an exemplary method for forming a first semiconductor structure is illustrated in accordance with some implementations of the present disclosure. It should be understood that the operations shown in FIGS. 6A-6C are not exhaustive and that other operations can be performed as well before, after, or between any of the illustrated operations. Further, some of the operations may be performed simultaneously, or in a different order than shown in FIGS. 6A-6C. FIGS. 7A-7L illustrate schematic cross-sectional views of an exemplary first semiconductor structure at certain fabricating stages of the method shown in FIGS. 6A-6C, according to some implementations of the present disclosure.

Referring to FIG. 6A, method 600A can start at operation 601, in which a dielectric stack can be formed on a first substrate, and multiple through stack holes can be formed to penetrate the dielectric stack.

Figure 7A:
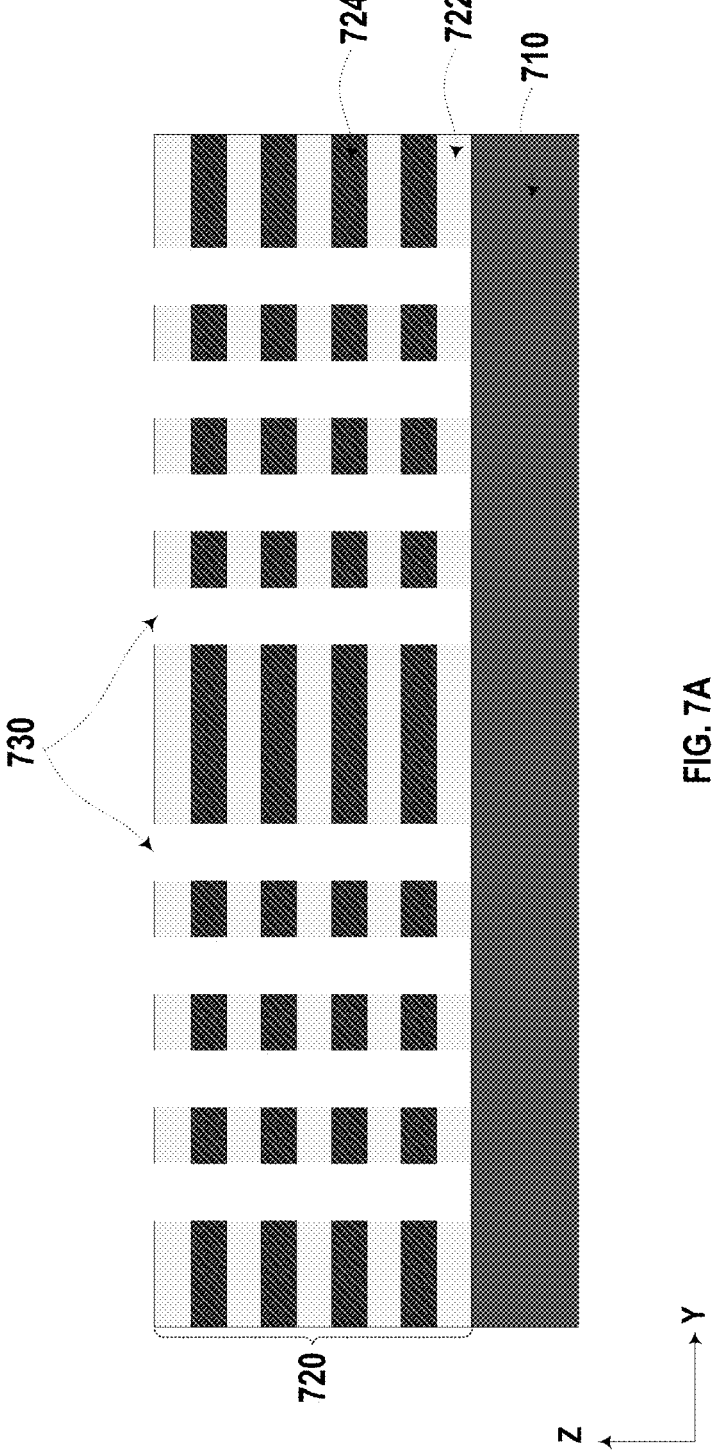
FIGS. 7A-7L illustrate a fabrication process for forming an exemplary 3D memory device according to some aspects of the present disclosure.

As shown in FIG. 7A, in some implementations, first substrate 710 can be any suitable semiconductor substrate having any suitable structure, such as a monocrystalline single-layer substrate, a polycrystalline silicon (polysilicon) single-layer substrate, a polysilicon and metal multi-layer substrate, etc. In some implementations, dielectric stack 720 including interleaved stack dielectric layers 722 and stack sacrificial layers 724 can be formed on first substrate 710. Dielectric stack 720 can include a plurality pairs of a first dielectric layer 724 (referred to herein as "stack sacrificial layer" 724) and a second dielectric layer 722 (referred to herein as "stack dielectric layer" 722, together referred to herein as "dielectric layer pairs"). Stack dielectric layers 722 and stack sacrificial layers 724 can be alternatingly deposited on first substrate 710 to form dielectric stack 720. In some implementations, each stack dielectric layer 722 includes a layer of silicon oxide, and each stack sacrificial layer 724 includes a layer of silicon nitride. Dielectric stack 720 can be formed by one or more thin film deposition processes including, but not limited to, CVD, PVD, ALD, or any combination thereof.

As shown in FIG. 7A, in some implementations, a plurality of through stack holes 730 can be formed in the dielectric stack 720. Each through stack hole 730 can vertically penetrate through the dielectric stack 720 and exposes or extends into the first substrate 710. In some implementations, the plurality of through stack holes 730 can be arranged in one or more arrays in a core region. In some implementations, fabrication processes for forming the through stack holes 730 include wet etching and/or dry etching.

In some implementations not shown in FIG. 7A, one or more staircase structures can be formed on one or more sides of dielectric stack 720. The staircase structures can be formed by performing a plurality of so-called "trim-etch" cycles to the dielectric layer pairs of dielectric stack 720 toward first substrate 710. Due to the repeated trim-etch cycles applied to the dielectric layer pairs of dielectric stack 720, dielectric stack 720 can have one or more tilted edges and a top dielectric layer pair shorter than the bottom one.

Referring back to FIG. 6A, a second subset of the through stack holes can be filled with a sacrificial material at operation 603, and a plurality of first-type through stack structures can be formed in a first subset of the through stack holes at operation 605.

Figure 7B:
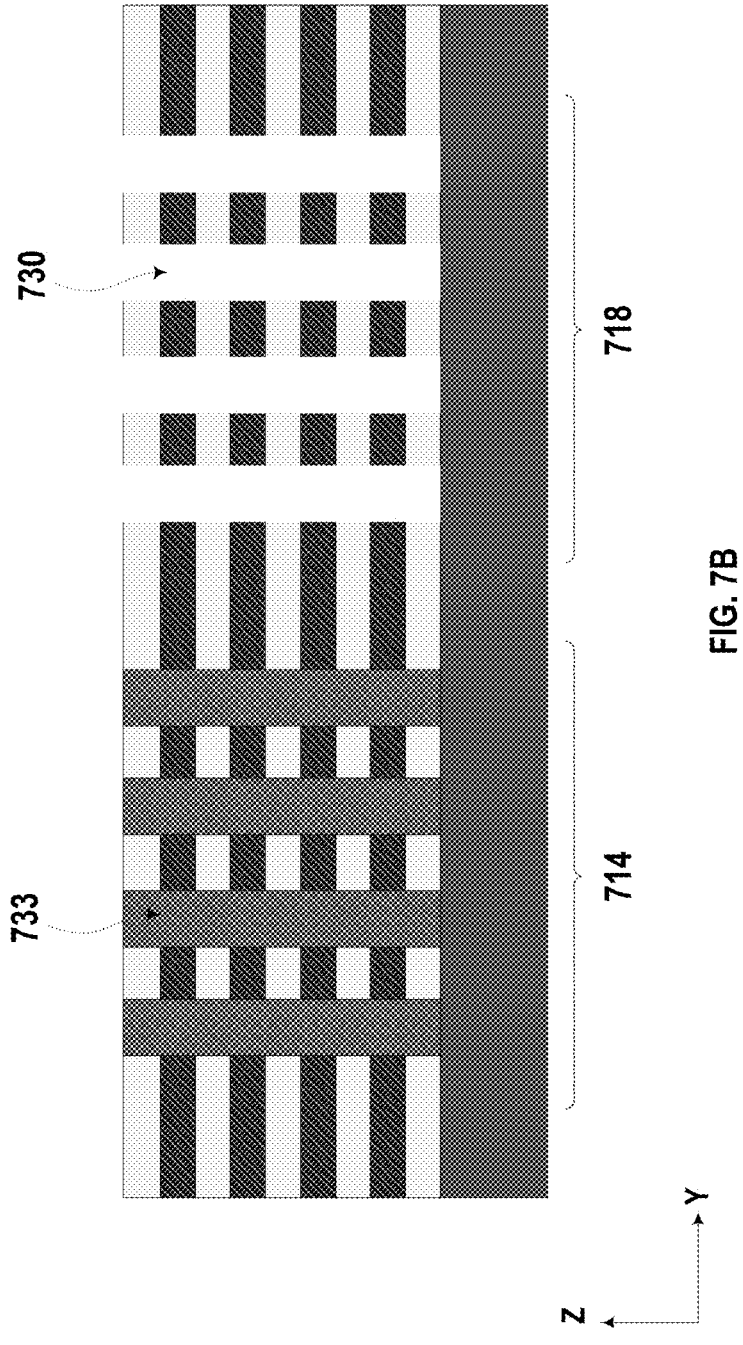

As shown in FIG. 7B, a first subset of the through stack holes in a first region 718 can be covered by a mask, while a second subset of the through stack holes in a second region 714 can be filled with a sacrificial material 733. In some implementations, the first subset of the through stack holes in a first region 718 are used to form a first-type memory cell array in the subsequent processes, and the second subset of the through stack holes in the second region 714 are used to form a second type memory cell array in the subsequent processes. The sacrificial material 733 can be different from the materials of the stack dielectric layers 722 and stack sacrificial layers 724. An etching process in the subsequent processes can have sufficiently high etching selectivity of the sacrificial material 733 over the stack dielectric layers 722 and stack sacrificial layers 724, such that the etching process can have minimal impact on the dielectric stack 720.

Figure 7C:
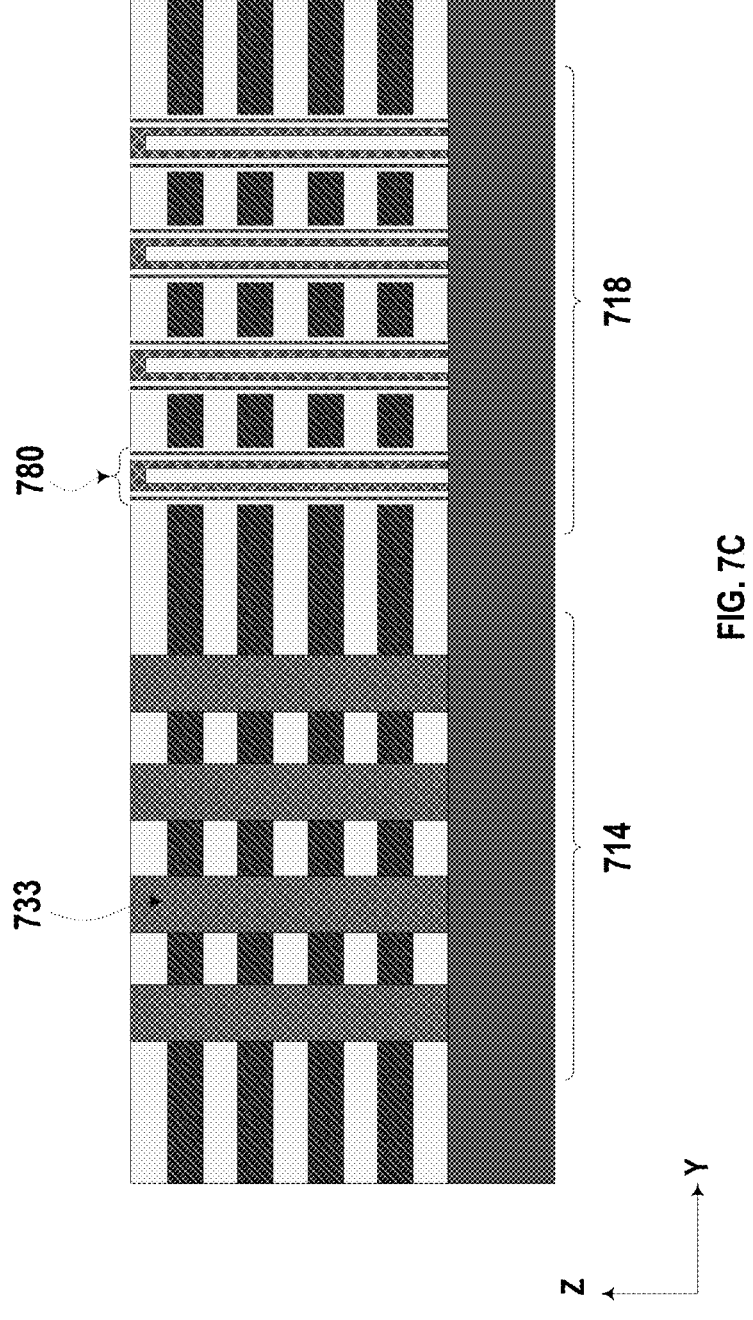

As shown in FIG. 7C, a plurality of NAND memory channel structures 780 are formed in the first subset of the through stack holes in the first region 718. In the following descriptions, NAND memory channel structures 780 are used as an example of the first-type through stack structures. It is noted that other type through stack structures, such as capacitor-type ferroelectric through stack structures or FET-type ferroelectric through stack structures can also be formed in the first subset of the through stack holes in the first region 718 as examples of the first-type through stack structures.

In some implementations, the structure of the NAND memory channel structure 780 can be referred to in the descriptions above in connection with FIG. 3A. The blocking layer, storage layer, tunneling layer, and semiconductor channel can be sequentially formed in this order along sidewalls and the bottom surface of each through stack hole. In some implementations, blocking layer, storage layer, and tunneling layer are first deposited along the sidewalls and bottom surface of the through stack hole in this order using one or more thin film deposition processes, such as ALD, CVD, PVD, any other suitable processes, or any combination thereof, to form the memory film. Semiconductor channel then can be formed by depositing a semiconductor material, such as polysilicon (e.g., undoped polysilicon), using one or more thin film deposition processes, such as ALD, CVD, PVD, any other suitable processes, or any combination thereof. In some implementations, a first silicon oxide layer, a silicon nitride layer, a second silicon oxide layer, and a polysilicon layer (an "ONOS" structure) are sequentially deposited to form the blocking layer, storage layer, tunneling layer, and semiconductor channel.

Referring back to FIG. 6A, the sacrificial material can be removed from the second subset of the through stack holes at operation 607, and a plurality of second-type through stack structures can be formed in the second subset of the through stack holes at operation 609.

Figure 7D:
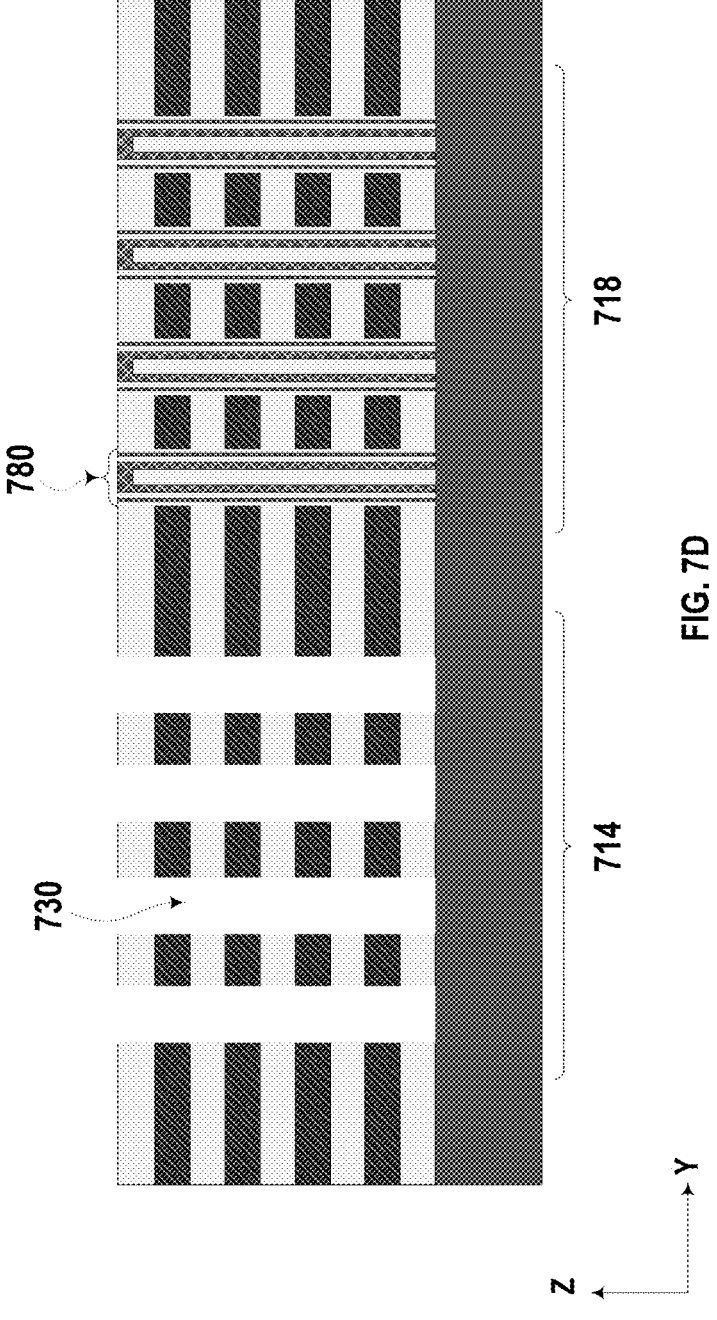
Figure 7E:
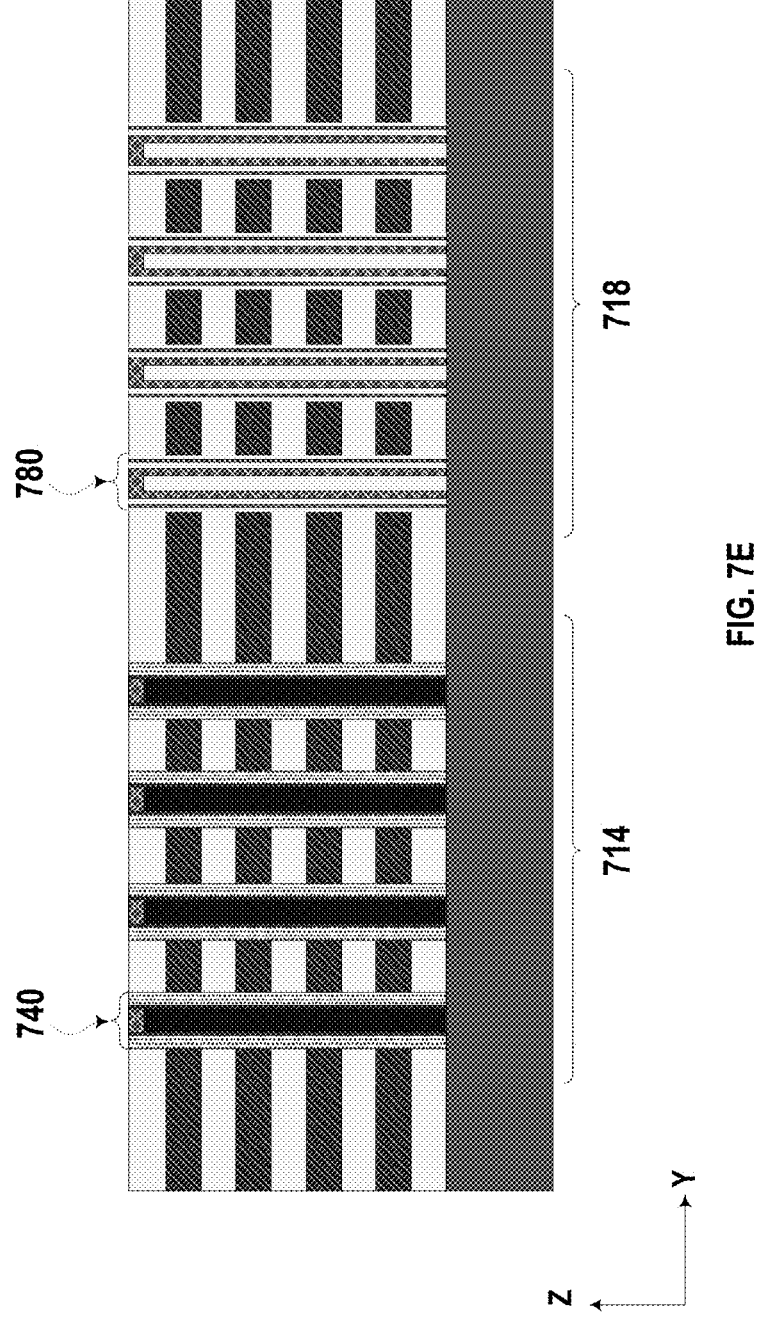

As shown in FIG. 7D, the sacrificial material 733 can be removed from the second subset of the through stack holes by using any suitable etching process to expose the second subset of the through stack holes 730 in the second region 714. As shown in FIG. 7E, a plurality of second-type through stack structures 740 can be formed in the second subset of the through stack holes 730 in the second region 714. In some implementations, the second-type through stack structures 740 can be capacitor-type ferroelectric through stack structures described above in connection with FIG. 3B. In some other implementations, the second-type through stack structures 740 can be FET-type ferroelectric through stack structures described above in connection with FIG. 3C.

Referring back to FIG. 6A, method 600A proceed to operation 611, in which a slit can be formed between the first-type through stack structures and the second-type through stack structures, and the dielectric stack can be converted into a memory stack, and a slit structure can be formed in the slit to isolate the first-type through stack structures from the second-type through stack structures at operation 613.

Figure 7F:
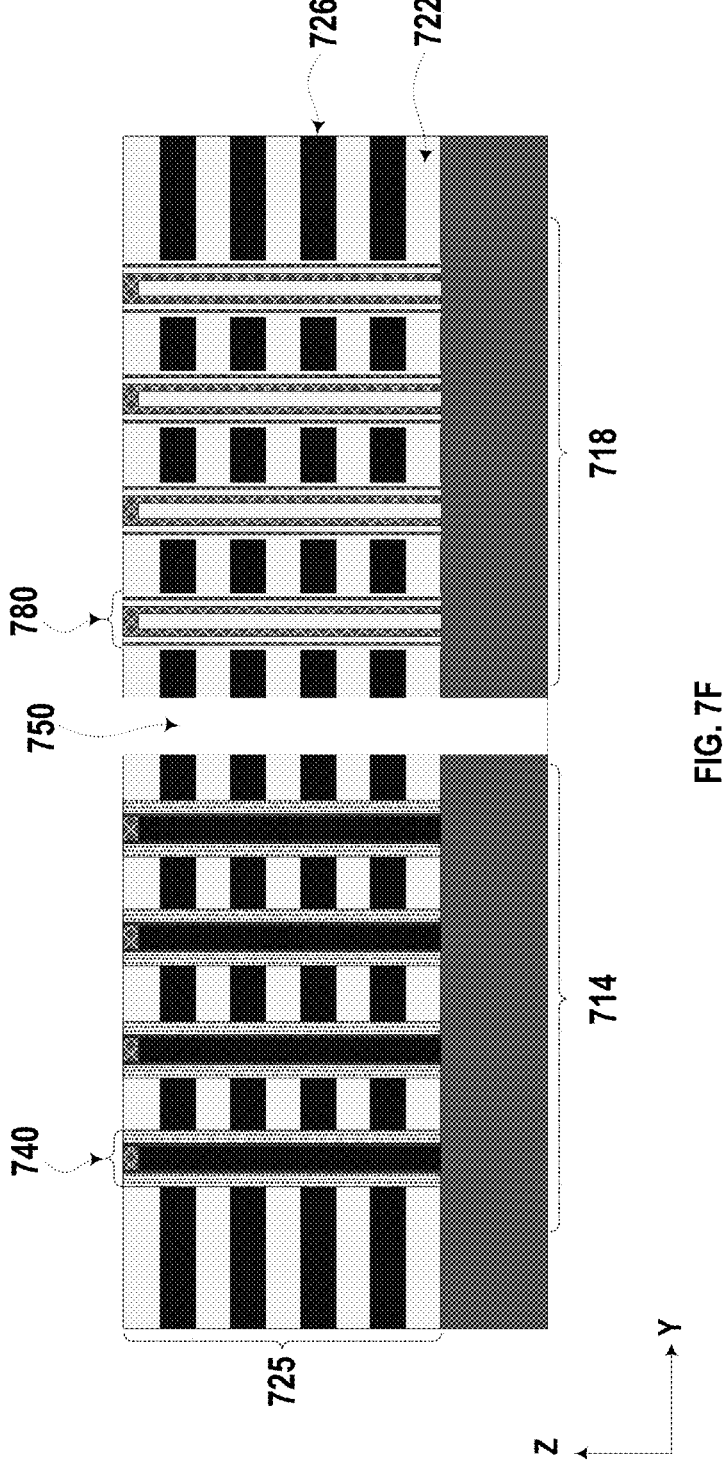

As shown in FIG. 7F, a slit 750 can be formed between the first region 718 and the second region 714 to separate the first-type through stack structures 780 in the first region 718 from the second-type through stack structures 740 in the second region 714. The slit can vertically penetrate through dielectric stack 720 and the first substrate 710 and can extend laterally in a straight line along the x-direction (i.e., WL direction) between two arrays of different types of through stack structures 740 and 780. Slit 750 can be formed by forming a mask layer (not shown) over dielectric stack 720 and patterning the mask using, e.g., photolithography, to form openings corresponding to the multiple slits in the patterned mask layer. A suitable etching process, e.g., dry etch and/or wet etch, can be performed to remove portions of dielectric stack 720 and first substrate 710 exposed by the openings. The mask layer can be removed after the formation of the slit 750.

A gate replacement can then be performed through the slit 750 to replace the stack sacrificial layers 724 in the dielectric stack 720 by multiple gate structures 726. After the gate replacement, dielectric stack 720 can become a memory stack 725, as shown in FIG. 7F. In some implementations, the stack sacrificial layers 724 in the dielectric stack 720 can be removed by applying etchants through the slit 750. Any suitable etching process, e.g., an isotropic dry etch or a wet etch, can be used to remove the stack sacrificial layers 724. The etching process can have sufficiently high etching selectivity of the material of stack sacrificial layers 724 over the materials of the stack dielectric layers 722, such that the etching process can have minimal impact on the stack dielectric layers 722. The isotropic dry etch and/or the wet etch can remove the stack sacrificial layers 724 in various directions to expose the top and bottom surfaces of each stack dielectric layer 722. As such, multiple horizontal trenches can then be formed interleaved between stack dielectric layers 722. Each horizontal trench can extend in a horizontal direction, and can be used as a space for a gate structure 726 to be formed in the subsequent processes. It is noted that, the term "horizontal/horizontally" used herein means nominally parallel to a lateral surface of first substrate 710.

In some implementations, stack sacrificial layers 724 include silicon nitride, and the etchant of the isotropic dry etch includes one or more of $CF_4$, $CHF_3$, $C_4F_8$, $C_4F_6$, and $CH_2F_2$. In some implementations, the stack sacrificial layers 724 include silicon nitride, and the etchant of the wet etch includes phosphoric acid. After stack sacrificial layers 724 are removed, the slit 750 and the multiple horizontal trenches can be cleaned by using any suitable cleaning process. For example, a phosphoric acid rinsing process can be performed to remove the impurities on the inner wall of the horizontal trenches.

In some implementations, gate structures 726 can be formed in horizontal trenches, as shown in FIG. 7F. In some implementations, each gate structure 726 can include a gate electrode (also referred to as stack conductive layer) wrapped by an insulating film (not shown) and a high-k dielectric layer (not shown). The insulating film and the high-k dielectric layer can be used as one or more gate dielectric layers for insulating the respective gate electrodes. In some implementations, the insulating film and the high-k dielectric layer can be formed to cover the exposed surfaces of the horizontal trenches with one or more suitable insulating materials. For example, one or more suitable deposition processes, such as CVD, PVD, and/or ALD, can be utilized to deposit the one or more insulating materials into the horizontal trenches. In some implementations, a recess etching process and/or a CMP process can be used to remove excessive insulating material(s). The one or more insulating materials can include any suitable materials that provide an electrical insulating function.

In some implementations, the gate electrodes can be formed in horizontal trenches respectively. The gate electrodes can be formed by filling the horizontal trenches with a suitable gate electrode metal material. The gate electrode metal material can include any suitable conductive material, e.g., tungsten, aluminum, copper, cobalt, or any combination thereof, for forming the word lines. The gate electrode material can be deposited into horizontal trenches using a suitable deposition method such as CVD, PVD, plasma-enhanced CVD (PECVD), sputtering, metal-organic chemical vapor deposition (MOCVD), and/or ALD.

Figure 7G:
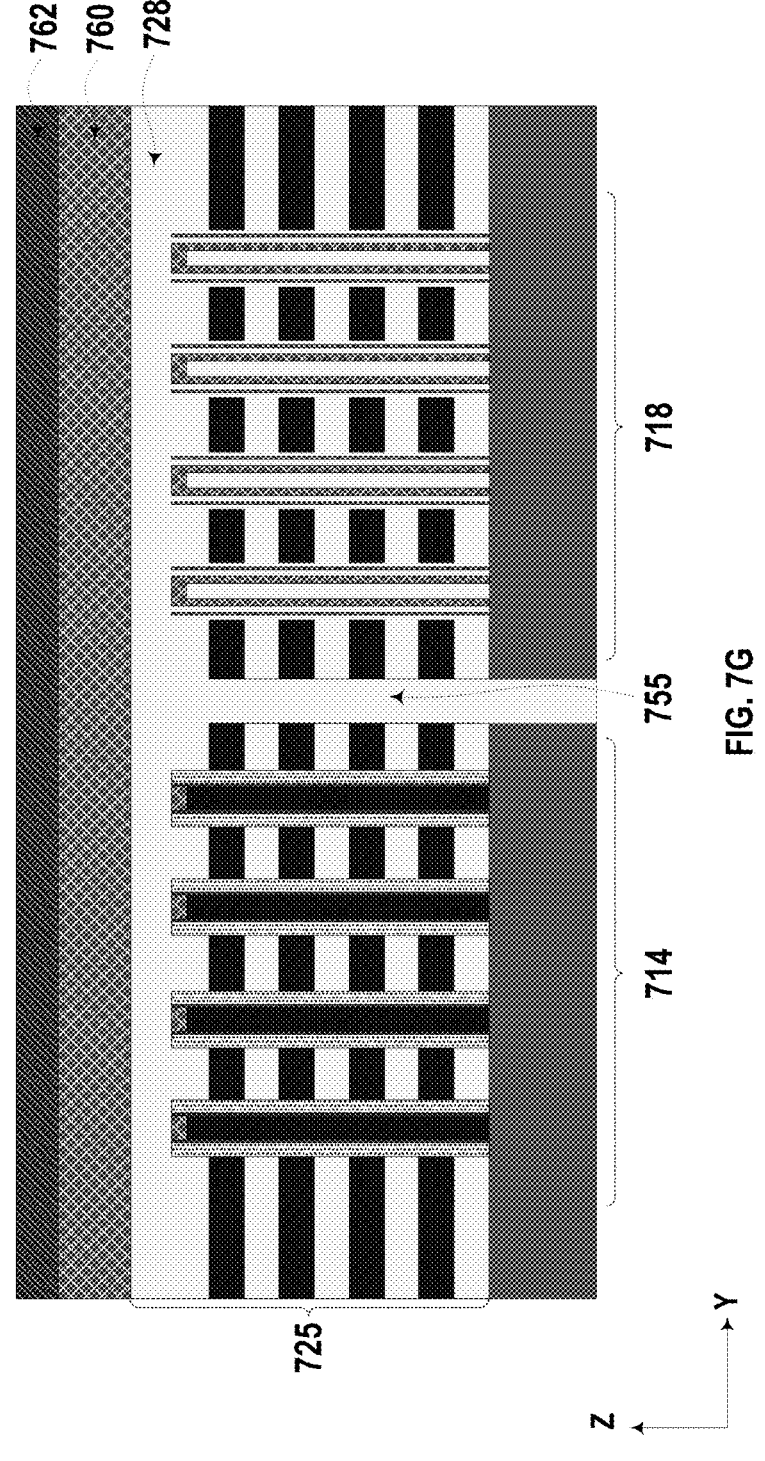
Figure 7H:
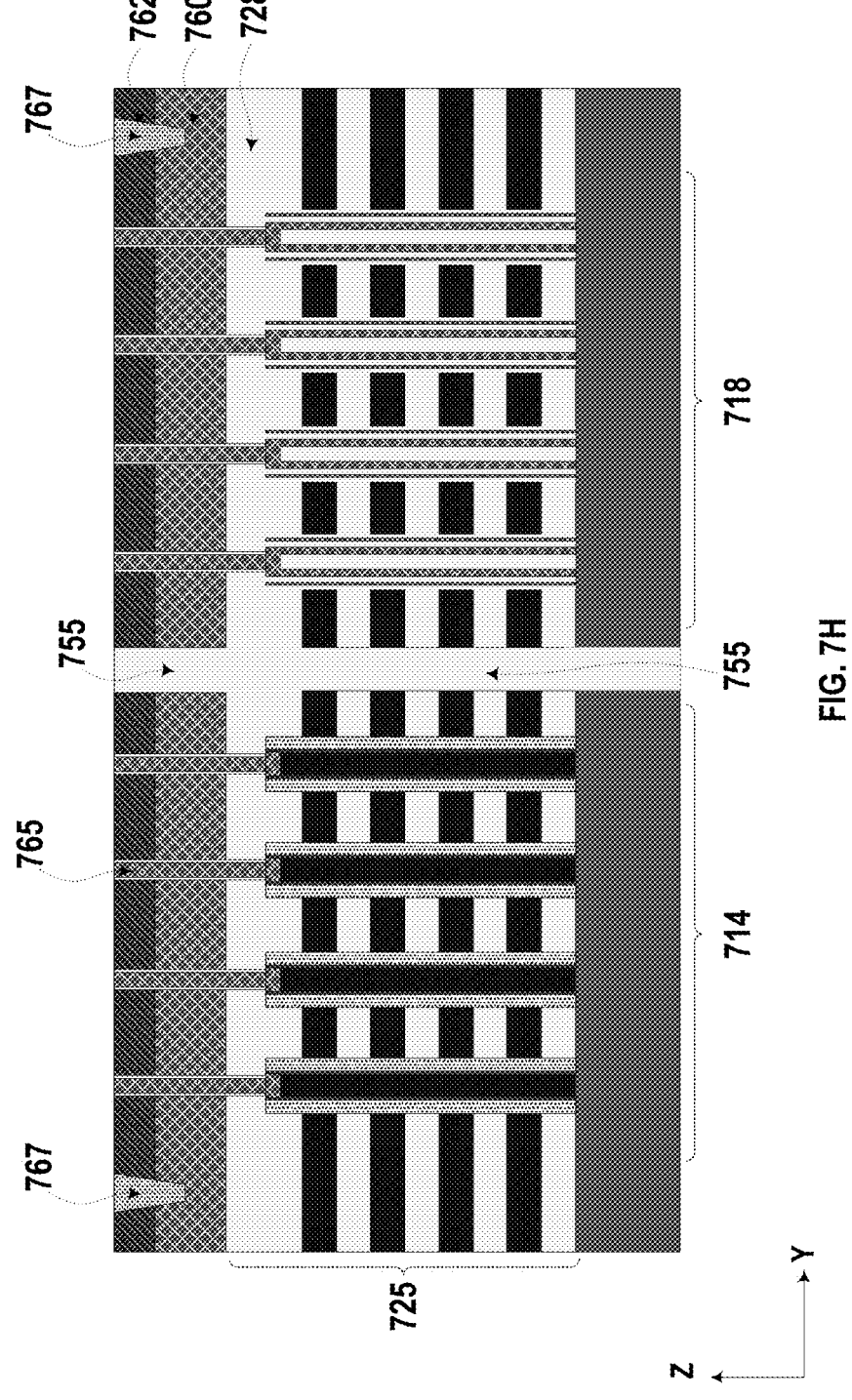

In some implementations, as shown in FIG. 7G, a dielectric material can be filled into the slit 750 by performing a deposition process to form a slit structure 755 (also referred to as a spacer 755). Slit structure 755 can be used to provide electrical insulation between the array of first-type through stack structures in the first region 718 from the array of second-type through stack structures in the second region 714. In some implementations, the dielectric material also covers the memory stack 725, as well as the array of first-type through stack structures in the first region 718 and the array of second-type through stack structures in the second region 714 to form an insulating layer 728.

Referring to FIG. 6B, a semiconductor layer can be formed on the first-type through stack structures and the second-type through stack structures at operation 615, one or more plugs can be formed in contact with the semiconductor layer, and multiple vias can be formed to penetrate the semiconductor layer and in contact with the first or second-type through stack structure at operation 617.

As shown in FIG. 7G, an isolation layer 760 can be formed on the insulating layer 728, and a semiconductor layer 762 can be formed on the isolation layer 760. The isolation layer 760 can include any suitable dielectric materials including, but not limited to, silicon oxide, silicon nitride, silicon oxynitride, low dielectric constant (low-k) dielectrics, or any combination thereof, that can have an electrical isolation function. The semiconductor layer 762 can have any suitable semiconductor materials, such as silicon (e.g., single crystalline silicon, c-silicon, or polycrystalline silicon), silicon germanium (SiGe), gallium arsenide (GaAs), germanium (Ge), or any other suitable semiconductor materials. In some implementations, the isolation layer 760 and the semiconductor layer 762 can be formed by any suitable deposition processes, such as CVD, PVD, plasma-enhanced CVD (PECVD), sputtering, metal-organic chemical vapor deposition (MOCVD), and/or ALD.

Figure 7I:
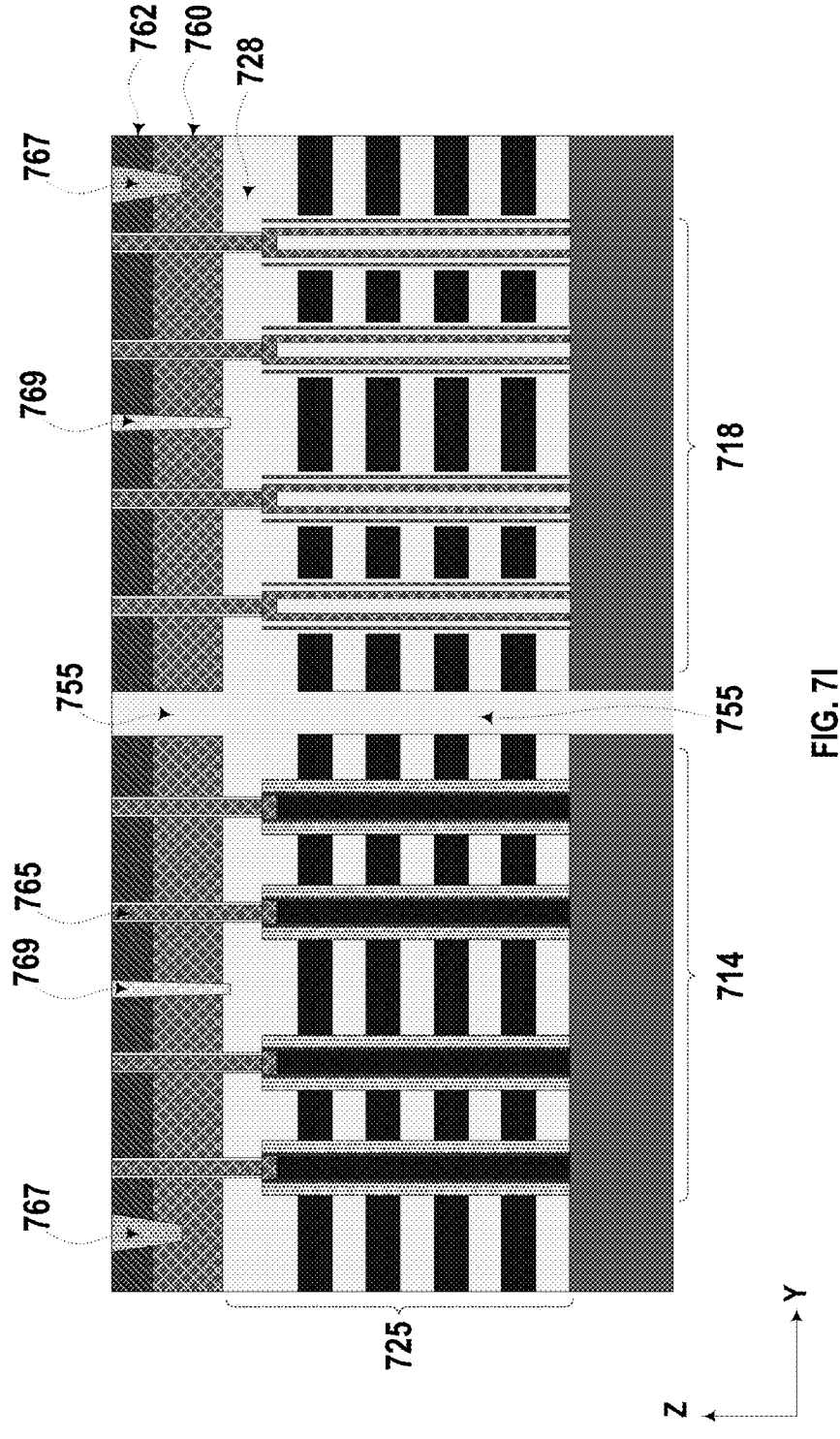

As shown in FIG. 7I, one or more plugs 767 can be formed in the semiconductor layer 762. A plurality of vias 765 can be formed to penetrate the semiconductor layer 762, the isolation layer 760, and the insulating layer 728. Each via 765 can be in contact with a corresponding first-type through stack structure or a corresponding second-type through stack structure. In some implementations, plug 767 can function as a top select gate contact, and via 765 can function as a through contact. It is noted that, each through contact 243 can be surrounded by a spacer to be isolated from semiconductor layer 241. In some implementations, one or more plugs 767 and the plurality of vias 765 can be formed by any suitable patterning process. For example, a mask layer (not shown) can be used in one or more etching processes to form openings at the positions for forming the one or more plugs 767 and the plurality of vias 765, and a followed deposition process can fill a conductive material into the openings to form the one or more plugs 767 and the plurality of vias 765.

Referring to FIG. 6B, method 600B can proceed to operation 619, in which the slit structure can be extended to separate a first portion of the semiconductor layer in the first region and a second portion of the semiconductor layer in the second region. Method 600B can then proceed to operation 621, in which a plurality of cut structures can further be formed to separate the first portion and the second portion of the semiconductor layer into multiple segments.

As shown in FIG. 7I, slit structure 755 can be extended in the vertical direction to further separate a first portion of the semiconductor layer 762 on the array of the first-type through stack structures in the first region 718 and a second portion of the semiconductor layer 762 on the array of the second-type through stack structures in the second region 714. A plurality of cut structures 769 can be formed to penetrate the semiconductor layer 762 and extend into the isolation layer 760 to further separate the first portion and the second portion of the semiconductor layer 762 into multiple segments. In some implementations, the extended slit structure 755 and the plurality of cut structures 769 can be formed by any suitable patterning process. For example, a mask layer (not shown) can be used in one or more etching processes to form trenches laterally extending along the x-direction (WL direction) and vertically penetrating the semiconductor layer 762, and a followed deposition process can fill a dielectric material into the trenches to form the extended slit structure 755 and the plurality of cut structures 769. A CMP process can then be performed to planarize the top surfaces of the one or more plugs 767, the plurality of vias 765, the slit structure 755, the plurality of cut structures 769, and the top surface of the semiconductor layer 762.

Referring to FIG. 6B, method 600B can proceed to operation 623, in which a first interconnect layer including a plurality of first interconnects can be formed on the semiconductor layer. Method 600B can then proceed to operation 625, in which a first bonding layer can be formed on the first interconnect layer.

Figure 7J:
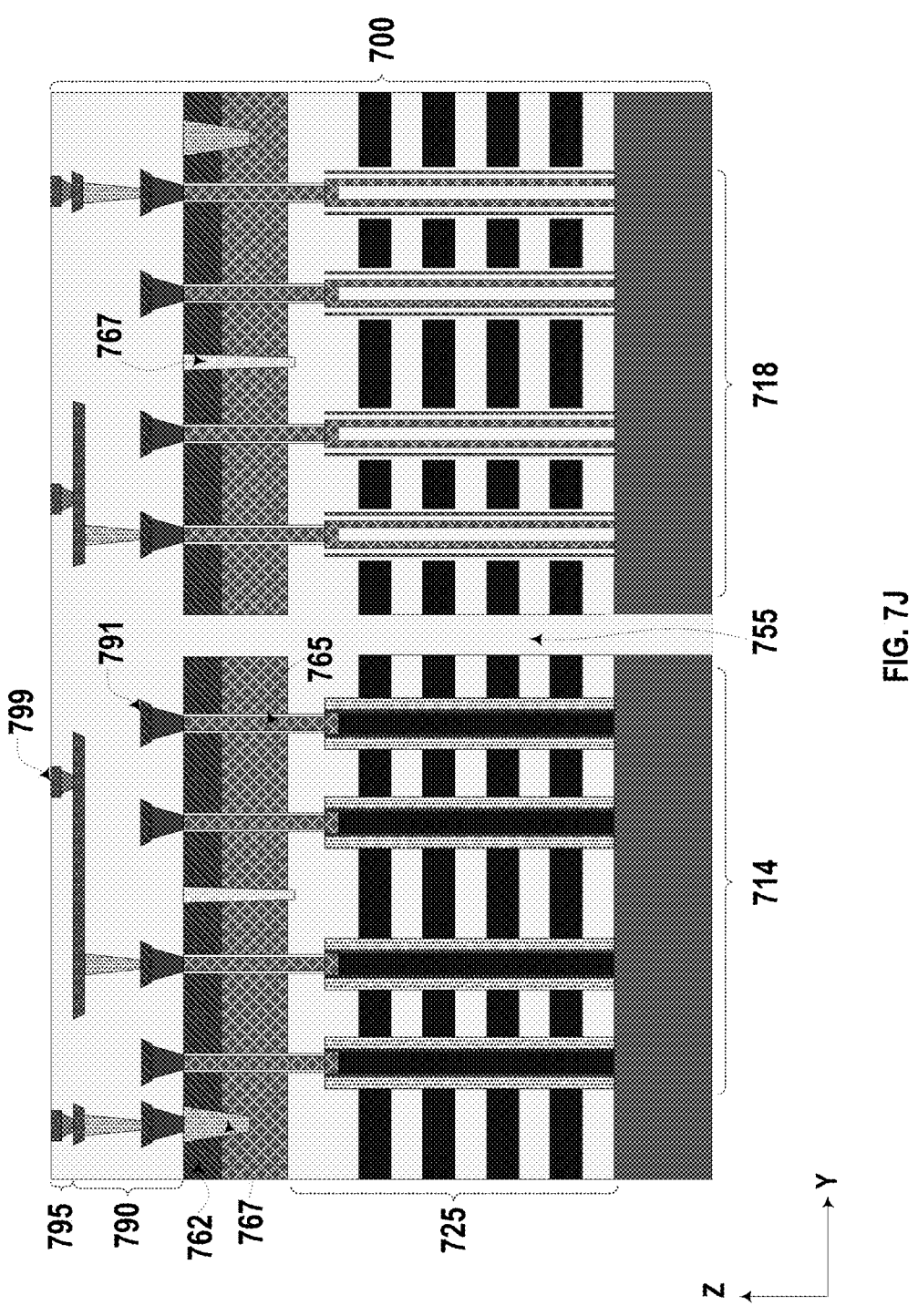

As shown in FIG. 7J, a first interconnect layer 790 is formed above the semiconductor layer 762. First interconnect layer 790 can include first interconnects 791 of MEOL and/or BEOL in a plurality of ILD layers to make electrical connections with the top select gate contacts 767 and/or vias 765. In some implementations, first interconnect layer 790 includes multiple ILD layers and first interconnects 791 therein formed in multiple processes. For example, the first interconnects 791 in first interconnect layer 790 can include conductive materials deposited by one or more thin film deposition processes including, but not limited to, CVD, PVD, ALD, electroplating, electroless plating, or any combination thereof. Fabrication processes to form first interconnects 791 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 7J can be collectively referred to as first interconnect layer 790.

A first bonding layer 795 can be formed on the first interconnect layer 790. First bonding layer 795 can include first bonding contacts 799 and dielectrics electrically isolating the first bonding contacts 799, which can be used, for example, for hybrid bonding as described below in detail. First bonding contacts 799 can be MEOL/BEOL interconnects and/or contact pads including any suitable conductive materials including, but not limited to W, Co, Cu, Al, silicides, or any combination thereof. As such, the first semiconductor structure can be formed.

Referring to FIG. 6C, method 600C proceeds to operation 627, in which a periphery circuit layer can be formed on a second substrate. Method 600C proceeds to operation 629, in which a second interconnect layer including multiple second interconnects can be formed on the peripheral circuit layer.

Figure 7K:
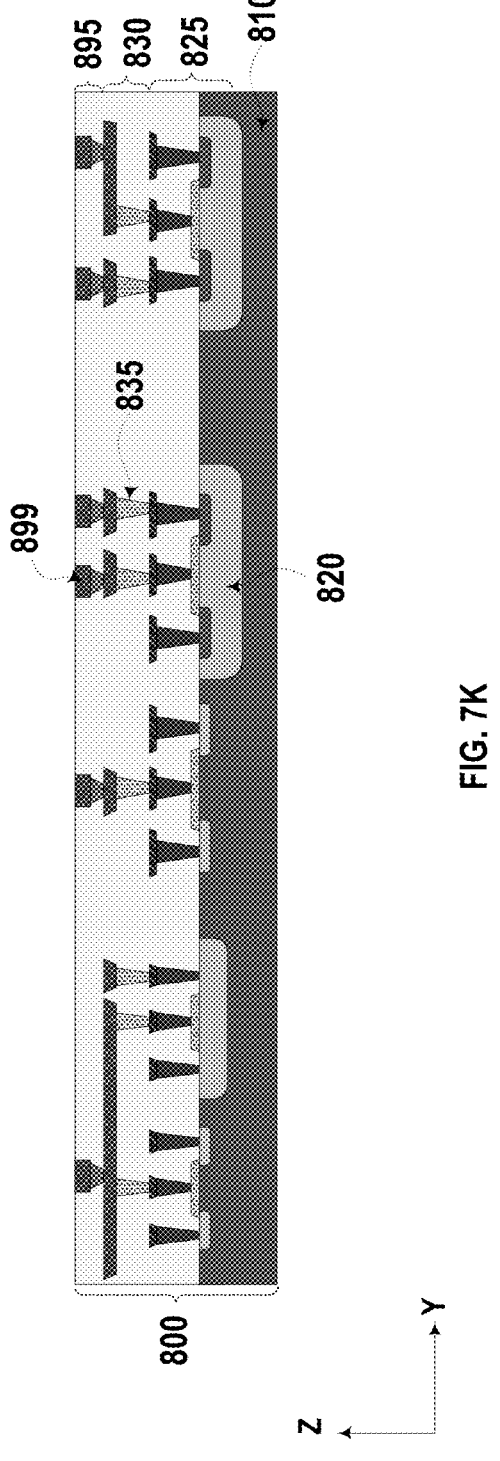

As illustrated in FIG. 7K, in some implementations, the second substrate 810 can be any suitable semiconductor substrate having any suitable structure, such as a monocrystalline single-layer substrate, a polycrystalline silicon (polysilicon) single-layer substrate, a polysilicon and metal multi-layer substrate, etc. The periphery circuit layer 825 is formed on the second substrate 810. The periphery circuit layer 825 can include a plurality of transistors 820. Transistors 820 can be formed by a plurality of processes including, but not limited to, photolithography, dry/wet etch, thin film deposition, thermal growth, implantation, CMP, and any other suitable processes. In some implementations, doped regions are formed in the second substrate 810 by ion implantation and/or thermal diffusion, which function, for example, as wells and source/drain regions of transistors 820. In some implementations, isolation regions (e.g., STIs, now shown) are also formed in the second substrate 810 by wet/dry etch and thin film deposition. It is understood that the details of fabricating different transistors 820 may vary depending on the types of the transistors 820 (e.g., planar transistors or 3D transistors) and thus, are not elaborated for ease of description.

In some implementations, a second interconnect layer 830 is formed above the transistors 820. The second interconnect layer 830 can include a plurality of second interconnects 835 of MEOL and/or BEOL in one or more ILD layers to make electrical connections with transistors 820. In some implementations, the second interconnect layer 830 includes multiple ILD layers and second interconnects 835 therein formed in multiple processes. For example, the second interconnects 835 in the second interconnect layer 830 can include conductive materials deposited by one or more thin film deposition processes including, but not limited to, CVD, PVD, ALD, electroplating, electroless plating, or any combination thereof. Fabrication processes to form the second interconnects 835 can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and second interconnects 835 illustrated in FIG. 7K can be collectively referred to as the second interconnect layer 830.

Referring back to FIG. 6C, method 600C proceeds to operation 631, in which a second bonding layer can be formed on the second interconnect layer of the second semiconductor structure. Method 6C then proceeds to operation 633, in which the second bonding layer of the second semiconductor structure can be bonded to the first bonding layer of the first semiconductor structure. The bonding can include hybrid bonding.

In some implementations, as shown in FIG. 7K, a second bonding layer 895 can be formed on the second interconnect layer 830. Second bonding layer 895 can include second bonding contacts 899 and dielectrics electrically isolating the second bonding contacts 899, which can be used, for example, for hybrid bonding as described below in detail. Second bonding contacts 899 can be MEOL/BEOL interconnects and/or contact pads including any suitable conductive materials including, but not limited to W, Co, Cu, Al, silicides, or any combination thereof. As such, the first semiconductor structure can be formed. As such, the second semiconductor structure 800 can be formed.

Figure 7L:
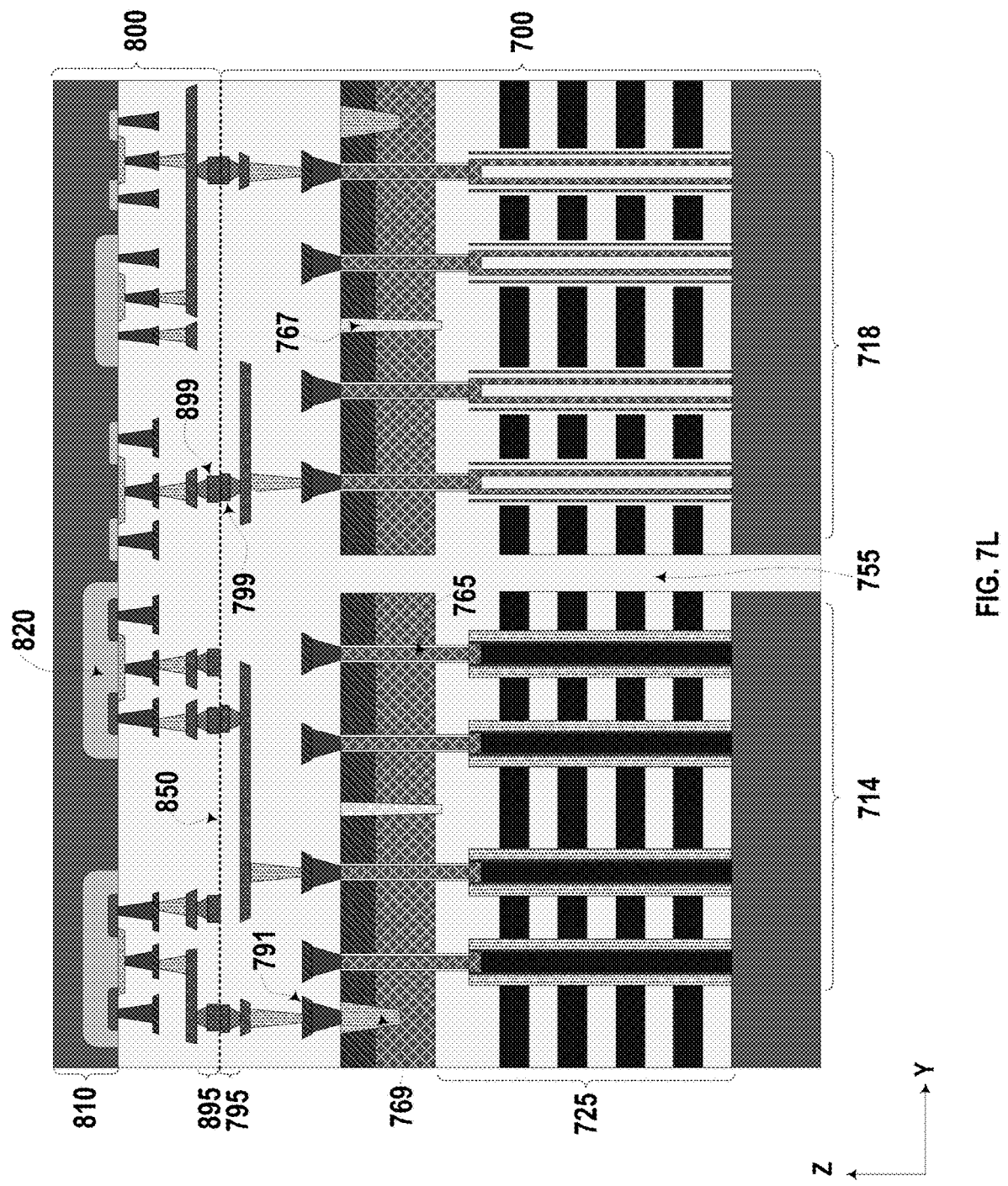

As illustrated in FIG. 7L, the second semiconductor structure 800 can be flipped upside down. The second bonding layer 895 in the second semiconductor structure 800 facing down is bonded with the first bonding layer 795 in the first semiconductor structure 700 facing up, i.e., in a face-to-face manner, thereby forming a bonding interface 850. The first bonding contacts 799 in the first bonding layer 795 are in contact with the second bonding contacts 899 in the second bonding layer 895 at the bonding interface 850. In some implementations, a treatment process, e.g., plasma treatment, wet treatment and/or thermal treatment, is applied to bonding surfaces prior to bonding.

As a result of the bonding, e.g., hybrid bonding, the first and second bonding contacts 799 and 899 on opposite sides of bonding interface 850 can be inter-mixed. After the bonding, the first bonding contacts 799 in the first bonding layer 795 are in contact with the second bonding contacts 899 in the second bonding layer 895 are aligned and in contact with one another, such that memory stack 725, as well as the NAND memory cell array and the ferroelectric memory cell array formed therethrough can be coupled to transistors 820 through the bonded bonding contacts 799 and 899 across the bonding interface 850, according to some implementations. Accordingly, the 3D memory structure is formed.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A method for forming a three-dimensional (3D) memory device, comprising:

forming a first semiconductor structure, comprising:

forming an array of first type through stack structures in a first region of a memory stack and an array of second type through stack structures in a second region of the memory stack;

forming a semiconductor layer including a first portion over the array of first type through stack structures and a second portion on the array of second type through stack structures;

forming a plurality of vias each penetrating the semiconductor layer and in contact with a corresponding one of the first type through stack structures or the second type through stack structures; and forming a slit structure to separate the array of first type through stack structures from the array of second type through stack structures, and to separate the first portion of the semiconductor layer from the second portion of the semiconductor layer.

2. The method of claim 1, wherein forming the first semiconductor structure further comprises:

forming a dielectric stack including a plurality of interleaved dielectric layers and sacrificial layers stacked on a first substrate, wherein the array of first type through stack structures and the array of second type through stack structures penetrate the dielectric stack;

forming a slit vertically penetrating the dielectric stack and laterally separating the array of first type through stack structures from the array of second type through stack structures; and replacing the plurality of sacrificial layers with a plurality of conductive layers to transform the dielectric stack into the memory stack;

wherein the slit structure is formed to fill the slit.

3. The method of claim 2, further comprising:
forming a second semiconductor structure including a periphery circuit on a second substrate; and
bonding the second semiconductor structure to the first semiconductor structure.

4. The method of claim 3, wherein forming the first type and second type through stack structures comprises:
forming a plurality of through stack holes each penetrating the dielectric stack;
filing a second subset of through stack holes with a sacrificial material;
forming the first type through stack structures in a first subset of through stack holes;
removing the sacrificial material in the second subset of through stack holes; and
forming the second type through stack structures in the second subset of through stack holes.

5. The method of claim 1, wherein:
forming the first type through stack structures comprises forming a NAND channel structure; and
forming the second type through stack structures comprises forming a capacitor-type ferroelectric through stack structure.

6. The method of claim 1, wherein:
forming the first type through stack structures comprises forming a NAND channel structure; and
forming the second type through stack structures comprises forming a FET-type ferroelectric through stack structure.

7. The method of claim 3, wherein forming the vias comprises:
forming a plurality of through holes each penetrating the semiconductor layer and exposing a corresponding first type or second type through stack structure;
filling the through holes with a dielectric material; and
forming the vias each in a corresponding through hole and surrounded by the dielectric material.

8. The method of claim 7, further comprising:
forming a plurality of cut structures each laterally extending between the vias and vertically separating portions of the semiconductor layer.

9. The method of claim 3, wherein:
forming the first semiconductor structure further comprises:
forming a first interconnect layer comprising a plurality of first interconnects in contact with the vias, and
forming a first bonding layer comprising a plurality of first bonding contact in contact with the first interconnects;
forming the second semiconductor structure comprises:
forming a second interconnect layer comprising a plurality of second interconnects in contact with a plurality of transistor of the periphery circuit, and
forming a second bonding layer comprising a plurality of second bonding contacts in contact with the second interconnects; and
bonding the second semiconductor structure to the first semiconductor structure comprises bonding the first bonding layer to the second bonding layer, such that each first bonding contact is joined with one corresponding second bonding contact.

10. A three-dimensional (3D) memory device, comprising:
a first semiconductor structure, comprising:
an array of first type through stack structures in a first region of a memory stack;

32 an array of second type through stack structures in a second region of the memory stack;
a semiconductor layer including a first portion on the array of first type through stack structures and a second portion on the array of second type through stack structures;
a plurality of vias each penetrating the semiconductor layer and in contact with a corresponding one of the first type through stack structures or the array of second type through stack structures; and
a slit structure separating the array of first type through stack structures from the array of second type through stack structures, and separating the first portion of the semiconductor layer from the second portion of the semiconductor layer.

11. The memory device of claim 10, further comprising:
a second semiconductor structure including a periphery circuit;
wherein the second semiconductor structure is bonded with the first semiconductor structure.

12. The memory device of claim 10, wherein:
the first type through stack structures are NAND channel structures; and
the second type through stack structures are capacitor-type ferroelectric through stack structures.

13. The memory device of claim 12, wherein each capacitor-type ferroelectric through stack structure comprises:
a ferroelectric layer; and
a conductive structure laterally surrounded by a dielectric film.

14. The memory device of claim 10, wherein:
the first type through stack structures are NAND channel structures; and
the second type through stack structures are FET-type ferroelectric through stack structures.

15. The memory device of claim 14, wherein each FET-type ferroelectric through stack structure comprises:
a ferroelectric layer;
a conductive layer laterally surrounded by the ferroelectric layer; and
a dielectric filling structure laterally surrounded by the conductive layer.

16. The memory device of claim 10, further comprises:
a dielectric layer on the semiconductor layer, wherein the vias each penetrates the dielectric layer and is isolated from the semiconductor layer by a dielectric material; and
a plurality of cut structures each laterally extending between the vias and vertically separating portions of the semiconductor layer.

17. The memory device of claim 11, wherein the first semiconductor structure further comprises:
a first interconnect layer comprising a plurality of first interconnects in contact with the vias; and
a first bonding layer comprising a plurality of first bonding contacts in contact with the first interconnects.

18. The memory device of claim 17, wherein the second semiconductor structure further comprises:
a second interconnect layer comprising a plurality of second interconnects in contact with a plurality of transistors of the periphery circuit; and
a second bonding layer comprising a plurality of second bonding contacts in contact with the second interconnects, wherein the first bonding layer and the second bonding layer are bonded at a bonding interface, such that each first bonding contact is joined with one corresponding second bonding contact.

19. A memory system, comprising:

a memory device configured to store data, and comprising:

an array of first type through stack structures in a first region and an array of second type through stack structures in a second region;

a semiconductor layer including a first portion on the array of first type through stack structures and a second portion on the array of second type through stack structures;

a plurality of vias each penetrating the semiconductor layer and in contact with a corresponding one of the first type through stack structures or the array of second type through stack structures; and a slit structure separating the array of first type through stack structures from the array of second type through stack structures, and separating the first portion of the semiconductor layer from the second portion of the semiconductor layer; and a memory controller coupled to the memory device and configured to control the memory device.

20. The memory system of claim 19, wherein:

the first type through stack structures are NAND channel structured; and the second type through stack structures are capacitor-type ferroelectric through stack structures or FET-type ferroelectric through stack structures.

\* \* \* \* \*